US012796225B2

(12) United States Patent
Li et al.

(10) Patent No.: US 12,796,225 B2
(45) Date of Patent: Nov. 10, 2026

(54) DISPLAY DEVICE INCLUDING CAPACITOR BY CONDUCTIVE PATTERN AND CHARGE GENERATION LAYER AND ELECTRONIC DEVICE INCLUDING THE DISPLAY DEVICE

(71) Applicant: Samsung Display Co., Ltd., Yongin-si (KR)

(72) Inventors: Xinxing Li, Suwon-si (KR); Jun-Woo Hyung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 570 days.

(21) Appl. No.: 18/111,296

(22) Filed: Feb. 17, 2023

(65) Prior Publication Data

US 2024/0032342 A1 Jan. 25, 2024

(30) Foreign Application Priority Data

Jul. 20, 2022 (KR) ........................ 10-2022-0089453

(51) Int. Cl.

*H10K 59/121* (2023.01)
*H10K 59/12* (2023.01)
*H10K 59/122* (2023.01)
*H10K 59/124* (2023.01)

(52) U.S. Cl.

CPC ..... *H10K 59/1216* (2023.02); *H10K 59/1201* (2023.02); *H10K 59/122* (2023.02); *H10K 59/124* (2023.02)

(58) Field of Classification Search

CPC ........... H10K 59/1216; H10K 59/1201; H10K 59/122; H10K 59/124; H10K 50/19; H10K 59/35; H10K 59/131; H10K 50/13; H10K 50/15; H10K 50/16; H10K 59/123; G09G 3/3233; G09G 2300/0842; G09G 2310/061; G09G 2320/0214

See application file for complete search history.

(56) References Cited

U.S. PATENT DOCUMENTS

2020/0212154 A1* 7/2020 Kim ..................... H10K 59/353
2021/0313537 A1* 10/2021 Yang ...................... H10K 50/15
2021/0351248 A1* 11/2021 Lee ...................... H10K 59/353

FOREIGN PATENT DOCUMENTS

KR 1020200068806 A 6/2020

* cited by examiner

*Primary Examiner* — Jacob Y Choi
*Assistant Examiner* — Grace Cha
(74) *Attorney, Agent, or Firm* — CANTOR COLBURN LLP

(57) ABSTRACT

A display device includes a base substrate including first, second, and third light-emitting areas respectively emitting light of different colors and a non-light-emitting area surrounding the first, second, and third light-emitting areas, an organic layer, and a conductive pattern disposed in the non-light-emitting area on the base substrate and constituting a blocking capacitor together with the charge generation layer. The organic layer includes a hole transport region disposed on the base substrate, a lower light-emitting layer disposed in each of the first, second, and third light-emitting areas on the hole transport region, a charge generation layer disposed on the lower light-emitting layer, an upper light-emitting layer disposed in each of the first, second, and third light-emitting areas on the charge generation layer, and an electron transport region disposed on the upper light-emitting layer.

24 Claims, 19 Drawing Sheets

DISPLAY DEVICE INCLUDING CAPACITOR BY CONDUCTIVE PATTERN AND CHARGE GENERATION LAYER AND ELECTRONIC DEVICE INCLUDING THE DISPLAY DEVICE

This application claims priority to Korean Patent Application No. 10-2022-0089453, filed on Jul. 20, 2022, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device providing visual information.

2. Description of the Related Art

With a development of information technology, an importance of a display device, which is a connection medium between a user and information, is being highlighted. A use of a display device such as a liquid crystal display device ("LCD"), an organic light-emitting display device ("OLED"), a plasma display device ("PDP"), a quantum dot display device, and the like is increasing.

The display device includes light-emitting elements, and the light-emitting element includes a pixel electrode, a common electrode, and a light-emitting layer disposed between the pixel electrode and the common electrode. In order to improve power efficiency of the light-emitting element, functional layers (e.g., a hole transport layer, an electron transport layer, an auxiliary layer, and the like) may be further disposed above and below the light-emitting layer.

SUMMARY

Embodiments provide a display device having improved color mixing defects.

A display device in embodiment of the disclosure includes a base substrate including first, second, and third light-emitting areas which respectively emit light of different colors and a non-light-emitting area surrounding the first, second, and third light-emitting areas, an organic layer including a hole transport region disposed on the base substrate, a lower light-emitting layer disposed in each of the first, second, and third light-emitting areas on the hole transport region, a charge generation layer disposed on the lower light-emitting layer, an upper light-emitting layer disposed in each of the first, second, and third light-emitting areas on the charge generation layer, and an electron transport region disposed on the upper light-emitting layer, and a conductive pattern disposed in the non-light-emitting area on the base substrate and constituting a blocking capacitor together with the charge generation layer.

In an embodiment, the display device may further include a pixel electrode disposed in each of the first, second, and third emitting areas between the base substrate and the organic layer, a connection pattern in the non-light-emitting area on the base substrate and including a same material as a material of the pixel electrode, and a pixel defining layer disposed on the base substrate, exposing a portion of an upper surface of the pixel electrode, and covering the connection pattern.

In an embodiment, the conductive pattern may be spaced apart from the pixel electrode in a plan view.

In an embodiment, the conductive pattern may be disposed on the pixel defining layer and connected to the connection pattern through a contact hole penetrating the pixel defining layer.

In an embodiment, the hole transport region may cover the conductive pattern.

In an embodiment, the display device may further include a pixel electrode disposed in each of the first, second, and third emitting areas between the base substrate and the organic layer. The conductive pattern may include a same material as a material of the pixel electrode.

In an embodiment, the display device may further include a pixel defining layer disposed on the base substrate and exposing a portion of an upper surface of the pixel electrode and a portion of an upper surface of the conductive pattern. The hole transport region may contact the portion of the upper surface of the conductive pattern exposed by the pixel defining layer.

In an embodiment, the display device may further include a pixel defining layer disposed on the base substrate, exposing a portion of an upper surface of the pixel electrode, and covering the conductive pattern.

In an embodiment, the display device may further include an active layer disposed on the base substrate, a gate electrode disposed on the active layer, a source electrode disposed on the gate electrode, and a drain electrode disposed in a same layer as the source electrode.

In an embodiment, the conductive pattern may include a same material as a material of the source electrode and the drain electrode.

In an embodiment, the display device may further include a planarization layer disposed on the base substrate and covering the source electrode, the drain electrode, and the conductive pattern.

In an embodiment, the planarization layer may include an organic insulating material.

In an embodiment, the display device may further include a planarization layer disposed on the base substrate, covering the source electrode and the drain electrode, and exposing a portion of an upper surface of the conductive pattern.

In an embodiment, the planarization layer may include an organic insulating material.

In an embodiment, the conductive pattern may be provided in plural.

In an embodiment, each of conductive patterns may be disposed at a center between two adjacent light-emitting areas among the first, second, and third areas in a plan view.

In an embodiment, the display device may further include a semiconductor element disposed in the non-light-emitting area on the base substrate and electrically connected to the conductive pattern.

In an embodiment, the semiconductor element may include a gate electrode which receives a light-emitting control signal, a source electrode which receives a blocking voltage, and a drain electrode connected to the conductive pattern of the blocking capacitor. The semiconductor element may supply the blocking voltage to the conductive pattern of the blocking capacitor during an activation period of the light-emitting control signal.

In an embodiment, the semiconductor element may include a gate electrode which receives a data initialization signal, a source electrode which receives an initialization voltage, and a drain electrode connected to the conductive pattern of the blocking capacitor. The semiconductor element may supply the initialization voltage to the conductive pattern of the blocking capacitor during an activation period of the data initialization signal.

A display device in an embodiment of the disclosure includes a base substrate, a pixel electrode disposed on the base substrate, a connection pattern disposed on the base substrate and including a same material as a material of the pixel electrode, an organic layer including a lower light-emitting layer disposed on the pixel electrode, a charge generation layer disposed on the lower light-emitting layer, and an upper light-emitting layer disposed on the charge generation layer, and a conductive pattern disposed on the connection pattern and constituting a blocking capacitor together with the charge generation layer.

In an embodiment, the display device may further include a pixel defining layer disposed on the base substrate, exposing a portion of an upper surface of the pixel electrode, and covering the connection pattern. The conductive pattern may be connected to the connection pattern through a contact hole penetrating the pixel defining layer.

In an embodiment, the conductive pattern may be spaced apart from the pixel electrode in a plan view.

In an embodiment, the conductive pattern may be plural.

In an embodiment, the display device may further include a semiconductor element disposed between the base substrate and the connection pattern, and electrically connected to the connection pattern. The semiconductor element may supply a blocking voltage or an initialization voltage to the conductive pattern of the blocking capacitor.

A display device in an embodiment of the disclosure may include a base substrate, an organic layer including a lower light-emitting layer, a charge generation layer and an upper light-emitting layer sequentially disposed on the base substrate, and a conductive pattern in a non-light-emitting area surrounding a light-emitting area on the base substrate and constituting a blocking capacitor together with the charge generation layer. Accordingly, since the blocking capacitor blocks a leakage current flowing between the adjacent sub-pixels, color mixing defects between the adjacent sub-pixels may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
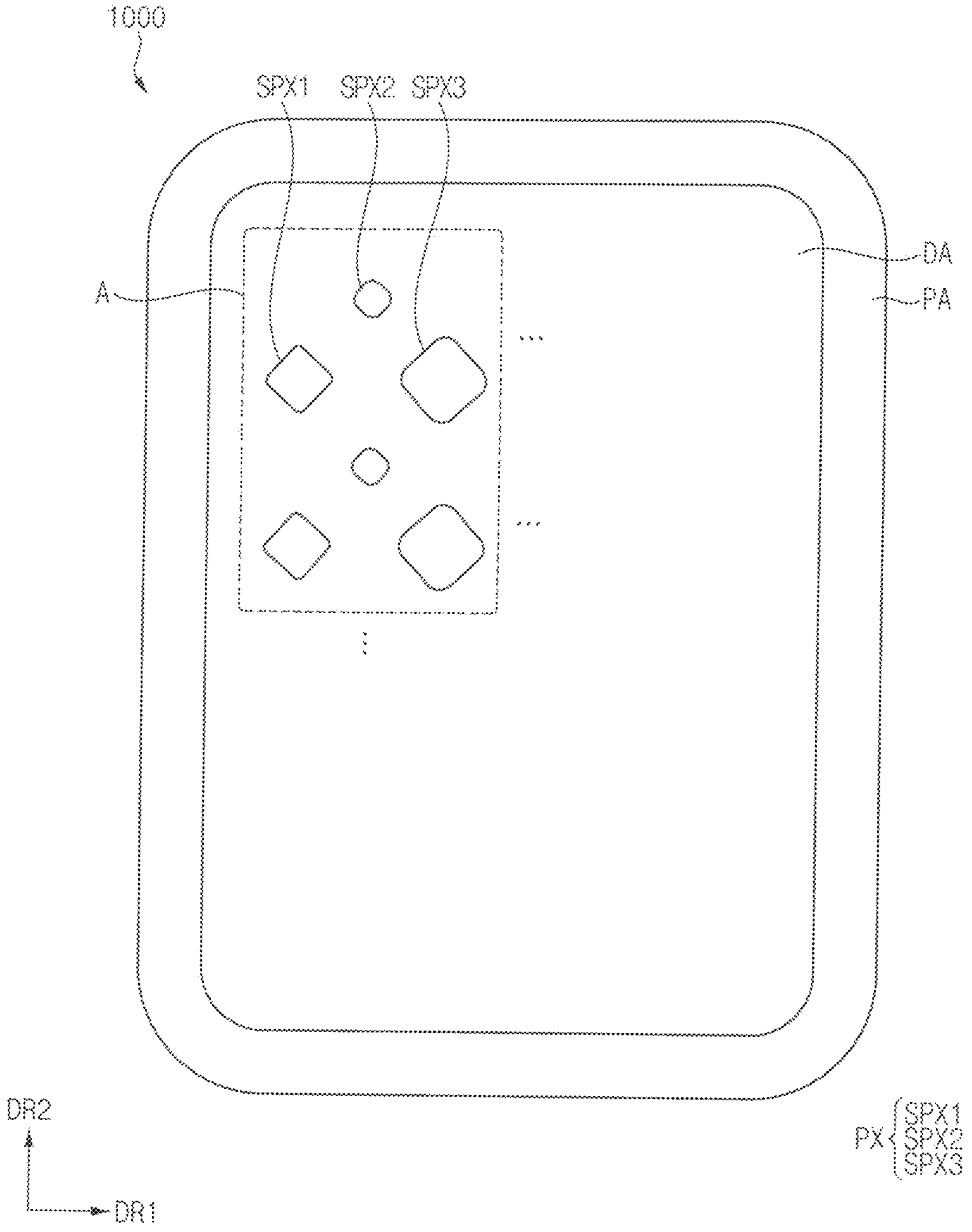
FIG. 1 is a plan view illustrating an embodiment of a display device.

Hereinafter, a display device in embodiments of the disclosure will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper,"

depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating an embodiment of a display device.

Referring to FIG. 1, the display device 1000 in an embodiment may include a display area DA and a peripheral area PA. The display area DA may be an area capable of displaying an image by generating light or adjusting transmittance of light provided from an external light source. The peripheral area PA may be an area that does not display an image. The peripheral area PA may be disposed around the display area DA. In an embodiment, the peripheral area PA may surround an entirety of the display area DA, for example.

The display device 1000 may have a quadrangular (e.g., rectangular) shape with rounded corners in a plan view. However, the configuration of the disclosure is not limited thereto. In an embodiment, the display device 1000 may have various shapes (e.g., a quadrangular (e.g., rectangular) shape with vertical corners) in a plan view, for example.

A plurality of pixels PX may be disposed in the display area DA. As the plurality of pixels PX emits light, the display area DA may display an image.

Each of the plurality of pixels PX may include a first sub-pixel SPX1, a second sub-pixel SPX2, and a third sub-pixel SPX3. The first, second, and third sub-pixels SPX1, SPX2, and SPX3 may respectively emit light of different colors. In an embodiment, the first sub-pixel SPX1 may be a red sub-pixel emitting red light, the second sub-pixel SPX2 may be a green sub-pixel emitting green light, and the third sub-pixel SPX3 may be a blue sub-pixel emitting blue light. However, the color of the light emitted by each of the first, second, and third sub-pixels SPX1, SPX2, and SPX3 is not limited thereto. In addition, although the first, second, and third sub-pixels SPX1, SPX2, and SPX3 are illustrated as being three, the disclosure is not limited thereto. In an embodiment, each of the plurality of pixels PX may further include a fourth sub-pixel emitting white light, for example.

The plurality of pixels PX may be repeatedly arranged along a first direction DR1 and a second direction DR2 crossing the first direction DR1. Accordingly, each of the first, second, and third sub-pixels SPX1, SPX2, and SPX3 may be repeatedly arranged in the first direction DR1 and the second direction DR2.

The display device 1000 may include drivers disposed in the peripheral area PA. In an embodiment, the drivers may include a gate driver, a data driver, or the like, for example. The drivers may be electrically connected to the plurality of pixels PX. The drivers may provide signals and voltages for emitting light to the plurality of pixels PX.

A plane may be defined in the first direction DR1 and the second direction DR2. In an embodiment, the second direction DR2 may be perpendicular to the first direction DR1, for example.

Figure 2:
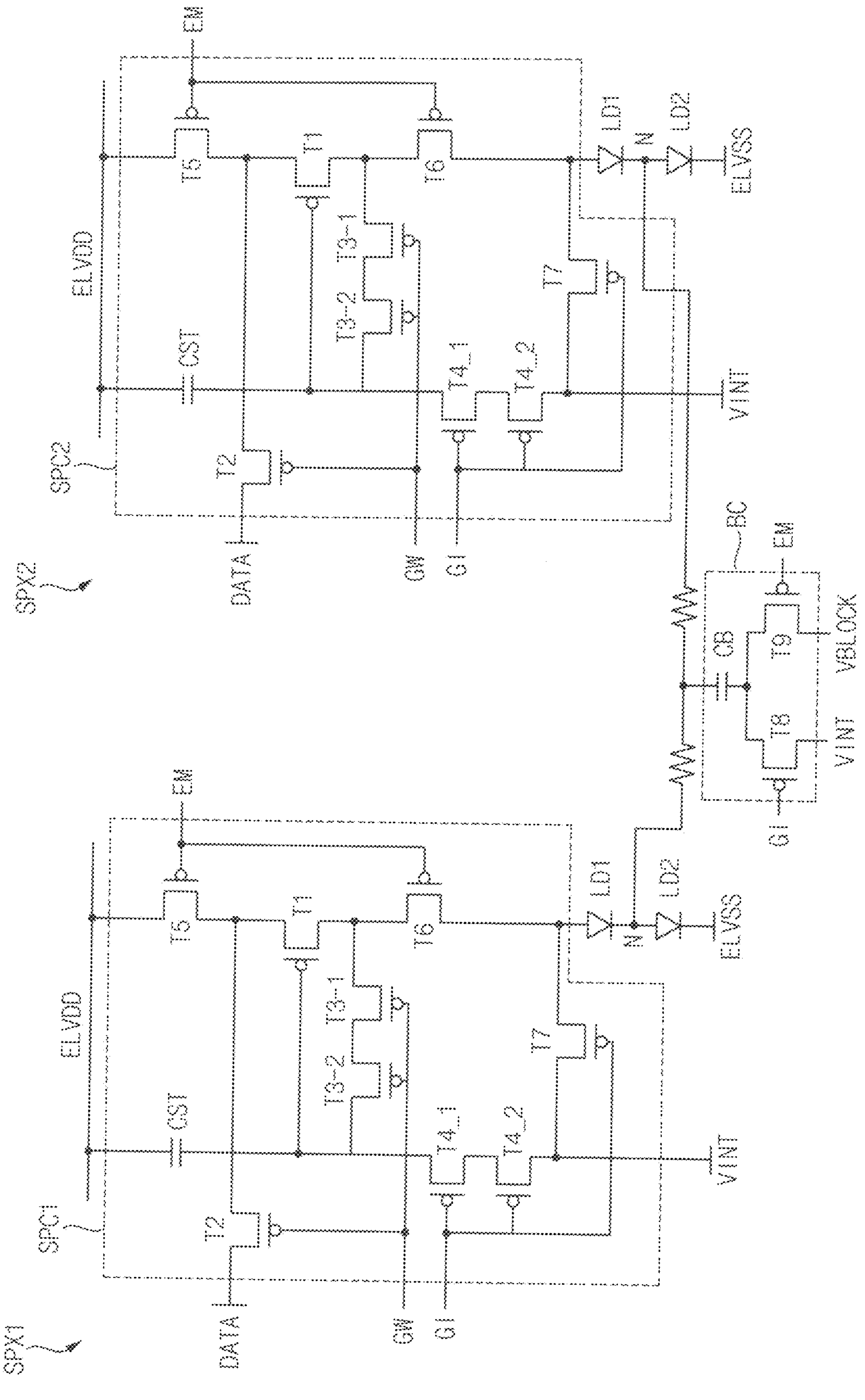
FIG. 2 is a circuit diagram illustrating an embodiment of a first sub-pixel and a second sub-pixel of the display device of FIG. 1.

FIG. 2 is a circuit diagram illustrating an embodiment of a first sub-pixel and a second sub-pixel of the display device of FIG. 1.

Referring to FIGS. 1 and 2, the display device 1000 in an embodiment may include the plurality of pixels PX, and each of the plurality of pixels PX may include the first sub-pixel SPX1, the second sub-pixel SPX2 and the third sub-pixel SPX3.

In an embodiment, the first sub-pixel SPX1 may include light-emitting diodes LD1 and LD2 and a first sub-pixel circuit SPC1 for driving the light-emitting diodes LD1 and LD2, for example. The second sub-pixel SPX2 may include light-emitting diodes LD1 and LD2 and a second sub-pixel circuit SPC2 for driving the light-emitting diodes LD1 and LD2.

Although not shown in FIG. 2, the third sub-pixel SPX3 may also have the same circuit structure as the first sub-pixel SPX1 and the second sub-pixel SPX2. That is, the first, second, and third sub-pixels SPX1, SPX2, and SPX3 may have the same circuit structure.

Each of the first and second sub-pixel circuits SPC1 and SPC2 may include first, second, third, fourth, fifth, sixth, and seventh transistors T1, T2, T3-1, T3-2, T4-1, T4-2, T5, T6, and T7, a storage capacitor CST, a driving voltage ELVDD line, a common voltage ELVSS line, an initialization voltage VINT line, a scan signal line which transits a scan signal GW, a data initialization signal line which transits a data initialization signal GI, and a light-emitting control signal line which transmits a light-emitting control signal EM.

The first and second light-emitting diodes LD1 and LD2 may form one light-emitting element. Accordingly, hereinafter, the first and second light-emitting diodes LD1 and LD2 will be treated as one configuration.

The first and second light-emitting diodes LD1 and LD2 may output light based on a driving current. The first and second light-emitting diodes LD1 and LD2 may include a first terminal and a second terminal. The first terminals of the first and second light-emitting diodes LD1 and LD2 may be connected to a second terminal of the seventh transistor T7. The second terminals of the first and second light-emitting diodes LD1 and LD2 may be supplied with the common voltage ELVSS. The first and second light-emitting diodes LD1 and LD2 may be connected through a node N between the first and second light-emitting diodes LD1 and LD2.

The first transistor T1 may include a gate terminal, a first terminal, and a second terminal. In an embodiment, the first terminal of the first transistor T1 may be a source terminal, and the second terminal of the first transistor T1 may be a drain terminal, for example. In an alternative embodiment, the first terminal of the first transistor T1 may be a drain terminal, and the second terminal of the first transistor T1 may be a source terminal.

The first transistor T1 may generate the driving current. In an embodiment, the first transistor T1 may operate in a saturation area, for example. In this case, the first transistor T1 may generate the driving current based on a voltage difference between the gate terminal and the source terminal. In addition, a grayscale may be expressed based on the magnitude of the driving current supplied to the light-emitting diodes LD1 and LD2. In this case, the grayscale may be expressed based on the sum of the times during which the driving current is supplied to the light-emitting diodes LD1 and LD2 within one frame.

The second transistor T2 may include a gate terminal, a first terminal, and a second terminal. The gate terminal of the second transistor T2 may receive the scan signal GW. The first terminal of the second transistor T2 may receive a data signal. The second terminal of the second transistor T2 may be connected to the first terminal of the first transistor T1. In an embodiment, the first terminal of the second transistor T2 may be a source terminal, and the second terminal of the second transistor T2 may be a drain terminal, for example. In an alternative embodiment, the first terminal of the second transistor T2 may be a drain terminal, and the second terminal of the second transistor T2 may be a source terminal.

The second transistor T2 may supply the data signal DATA to the first terminal of the first transistor T1 during the activation period of the scan signal GW. In this case, the second transistor T2 may operate in a linear area.

The third transistors T3-1 and T3-2 may include a (3-1)th transistor T3-1 and a (3-2)th transistor T3-2. In an embodiment, the (3-1)th transistor T3-1 and the (3-2)th transistor T3-2 may be connected in series and may operate as a dual transistor, for example. In an embodiment, when the dual transistor is turned off, leakage current may be reduced, for example.

Each of the (3-1)th transistor T3-1 and the (3-2)th transistor T3-2 may include a gate terminal, a first terminal, and a second terminal. The gate terminal of each of the (3-1)th transistor T3-1 and the (3-2)th transistor T3-2 may receive the scan signal GW. The first terminal of the (3-1)th transistor T3-1 may be connected to the second terminal of the first transistor T1. The second terminal of the (3-1)th transistor T3-1 may be connected to the first terminal of the (3-2)th transistor T3-2. The second terminal of the (3-2)th transistor T3-2 may be connected to the gate terminal of the first transistor T1. In an embodiment, the first terminal of each of the (3-1)th transistor T3-1 and the (3-2)th transistor T3-2 may be a source terminal, and the (3-1)th transistor T3-1 and the (3-2)th transistor T3-2 may be a drain terminal, for example. In an alternative embodiment, the first terminal of each of the (3-1)th transistor T3-1 and the (3-2)th transistor T3-2 may be a drain terminal, and the (3-1)th transistor T3-1 and the (3-2)th transistor T3-2 may be a source terminal.

The third transistors T3-1 and T3-2 may connect the gate terminal of the first transistor T1 and the first terminal of the first transistor T1 during the activation period of the scan signal GW. In this case, the third transistors T3-1 and T3-2 may diode-connect the first transistor T1 during the activation period of the scan signal GW. Since the first transistor T1 is diode-connected, a voltage difference equal to the threshold voltage of the first transistor T1 may occur between the first terminal of the first transistor T1 and the gate terminal of the first transistor T1. As a result, the voltage obtained by adding the voltage difference (i.e., the threshold voltage) to the voltage of the data signal DATA supplied to the first terminal of the first transistor T1 during the activation period of the scan signal GW may be supplied to the gate terminal of the transistor T1. That is, the data signal DATA may be compensated by the threshold voltage of the first transistor T1, and the compensated data signal DATA may be supplied to the gate terminal of the first transistor T1.

The fourth transistors T4-1 and T4-2 may include a (4-1)th transistor T4-1 and a (4-2)th transistor T4-2. In an embodiment, the (4-1)th transistor T4-1 and the (4-2)th transistor T4-2 may be connected in series and may operate as a dual transistor, for example. In an embodiment, when the dual transistor is turned off, the leakage current may be reduced, for example.

Each of the (4-1)th transistor T4-1 and the (4-2)th transistor T4-2 may include a gate terminal, a first terminal, and a second terminal. The gate terminal of each of the (4-1)th transistor T4-1 and the (4-2)th transistor T4-2 may receive the data initialization signal GI. The first terminal of each of the (4-1)th transistor T4-1 and the (4-2)th transistor T4-2 may be supplied with the initialization voltage VINT. The second terminal of each of the (4-1)th transistor T4-1 and the (4-2)th transistor T4-2 may be connected to the gate terminal of the first transistor T1. In an embodiment, the first terminal of each of the (4-1)th transistor T4-1 and the (4-2)th transistor T4-2 may be a source terminal, and the second terminal of each of the (4-1)th transistor T4-1 and the (4-2)th transistor T4-2 may be a drain terminal, for example. In an alternative embodiment, the second terminal of each of the (4-1) th transistor T4-1 and the (4-2)th transistor T4-2 may be a source terminal, and the first terminal of each of the (4-1)th transistor T4-1 and the (4-2)th transistor T4-2 may be a drain terminal.

The fourth transistors T4-1 and T4-2 may supply the initialization voltage VINT to the gate terminal of the first transistor T1 during the activation period of the data initialization signal GI. In this case, the fourth transistors T4-1 and T4-2 may operate in a linear area. That is, the fourth transistors T4-1 and T4-2 may initialize the gate terminal of the first transistor T1 to the initialization voltage VINT during the activation period of the data initialization signal GI.

The fifth transistor T5 may include a gate terminal, a first terminal, and a second terminal. The gate terminal of the fifth transistor T5 may receive the light-emitting control signal EM. The first terminal of the fifth transistor T5 may receive the driving voltage ELVDD. The second terminal of the fifth transistor T5 may be connected to the first terminal of the first transistor T1. In an embodiment, the first terminal of the fifth transistor T5 may be a source terminal, and the second terminal of the fifth transistor T5 may be a drain terminal, for example. In an alternative embodiment, the first terminal of the fifth transistor T5 may be a drain terminal, and the second terminal of the fifth transistor T5 may be a source terminal.

The fifth transistor T5 may supply the driving voltage ELVDD to the first terminal of the first transistor T1 during the activation period of the light-emitting control signal EM. Conversely, the fifth transistor T5 may cut off the supply of the driving voltage ELVDD during the inactivation period of the light-emitting control signal EM. In this case, the fifth transistor T5 may operate in a linear area. When the fifth transistor T5 supplies the driving voltage ELVDD to the first terminal of the first transistor T1 during the activation period of the light-emitting control signal EM, the first transistor T1 generates the driving current. In addition, since the fifth transistor T5 cuts off the supply of the driving voltage ELVDD during the inactivation period of the light-emitting control signal EM, the data signal DATA supplied to the first terminal of the first transistor T1 may be supplied to the gate terminal of the first transistor T1.

The sixth transistor T6 may include a gate terminal, a first terminal, and a second terminal. The gate terminal of the sixth transistor T6 may receive the light-emitting control signal EM. The first terminal of the sixth transistor T6 may be connected to the second terminal of the first transistor T1. The second terminal of the sixth transistor T6 may be connected to the first terminal of the first light-emitting diode LD1. In an embodiment, the first terminal of the sixth transistor T6 may be a source terminal, and the second terminal of the sixth transistor T6 may be a drain terminal, for example. In an alternative embodiment, the first terminal of the sixth transistor T6 may be a drain terminal, and the second terminal of the sixth transistor T6 may be a source terminal.

The sixth transistor T6 may supply the driving current generated by the first transistor T1 to the light-emitting diodes LD1 and LD2 during the activation period of the light-emitting control signal EM. In this case, the sixth transistor T6 may operate in a linear area. That is, when the sixth transistor T6 supplies the driving current generated by the first transistor T1 to the light-emitting diodes LD1 and LD2 during the activation period of the light-emitting control signal EM, the light-emitting diodes LD1 and LD2 may output light. In addition, since the sixth transistor T6 electrically separates the first transistor T1 and the light-emitting diodes LD1 and LD2 from each other during the inactivation period of the light-emitting control signal EM, the data signal DATA supplied to the second terminal of the first transistor T1 may be supplied to the gate terminal of the first transistor T1.

The seventh transistor T7 may include a gate terminal, a first terminal, and a second terminal. The gate terminal of the seventh transistor T7 may receive the data initialization signal GI. The first terminal of the seventh transistor T7 may receive the initialization voltage VINT. The second terminal of the seventh transistor T7 may be connected to the first terminal of the first light-emitting diode LD1. In an embodiment, the first terminal of the seventh transistor T7 may be a source terminal, and the second terminal of the seventh transistor T7 may be a drain terminal, for example. In an alternative embodiment, the first terminal of the seventh transistor T7 may be a drain terminal, and the second terminal of the seventh transistor T7 may be a source terminal.

The seventh transistor T7 may supply the initialization voltage VINT to the first terminal of the first light-emitting diode LD1 during the activation period of the data initialization signal GI. In this case, the seventh transistor T7 may operate in a linear area. That is, the seventh transistor T7 may initialize the first terminal of the first light-emitting diode LD1 to the initialization voltage VINT during the activation period of the data initialization signal GI.

The storage capacitor CST may include a first terminal and a second terminal. The storage capacitor CST may be connected between the driving voltage ELVDD line and the gate terminal of the first transistor T1. In an embodiment, the first terminal of the storage capacitor CST may be connected to the gate terminal of the first transistor T1, and the second terminal of the storage capacitor CST may be connected to the driving voltage ELVDD line, for example.

The storage capacitor CST may maintain the voltage level of the gate terminal of the first transistor T1 during the inactive period of the scan signal GW. The inactivation period of the scan signal GW may include an activation period of the light-emitting control signal EM, and the driving current generated by the first transistor T1 during the activation period of the light-emitting control signal EM may be supplied to the first and second light-emitting diodes LD1 and LD2. Accordingly, the driving current generated by the first transistor T1 may be supplied to the first and second light-emitting diodes LD1 and LD2 based on the voltage level maintained by the storage capacitor CST.

In an embodiment, the display device 1000 may further include a blocking circuit BC electrically connected to the first sub-pixel circuit SPC1 and the second sub-pixel circuit SPC2. The blocking circuit BC may include an eighth transistor T8, a ninth transistor T9, and a blocking capacitor CB.

The eighth transistor T8 may include a gate terminal, a first terminal, and a second terminal. The gate terminal of the eighth transistor T8 may receive the data initialization signal GI. The first terminal of the eighth transistor T8 may receive the initialization voltage VINT. The second terminal of the eighth transistor T8 may be connected to the first terminal of the blocking capacitor CB. In an embodiment, the first terminal of the eighth transistor T8 may be a source terminal, and the second terminal of the eighth transistor T8 may be a drain terminal, for example. In an alternative embodiment, the first terminal of the eighth transistor T8 may be a drain terminal, and the second terminal of the eighth transistor T8 may be a source terminal.

The ninth transistor T9 may include a gate terminal, a first terminal, and a second terminal. The gate terminal of the ninth transistor T9 may receive the light-emitting control signal EM. The first terminal of the ninth transistor T9 may receive a blocking voltage VBLOCK. The second terminal of the ninth transistor T9 may be connected to the first terminal of the blocking capacitor CB. In an embodiment, the first terminal of the ninth transistor T9 may be a source terminal, and the second terminal of the ninth transistor T9 may be a drain terminal, for example. In an alternative embodiment, the first terminal of the ninth transistor T9 may be a drain terminal, and the second terminal of the ninth transistor T9 may be a source terminal.

The blocking capacitor CB may include a first terminal and a second terminal. The first terminal of the blocking capacitor CB may be connected to the second terminal of the eighth transistor T8 and the second terminal of the ninth transistor T9, respectively. The second terminal of the blocking capacitor CB may be connected to the node N between the first light-emitting diode LD1 and the second light-emitting diode LD2 of the first sub-pixel SPX1 and may be connected to the node N between the first light-emitting diode LD1 and the second light-emitting diode LD2 of the second sub-pixel SPX2, respectively.

However, although each of the sub-pixels SPX1 and SPX2 of the disclosure has been described as including seven transistors and one storage capacitor, the configuration of the disclosure is not limited thereto. In an embodiment, each of the sub-pixels SPX1 and SPX2 may have a configuration including at least one transistor and at least one storage capacitor, for example.

Figure 3:
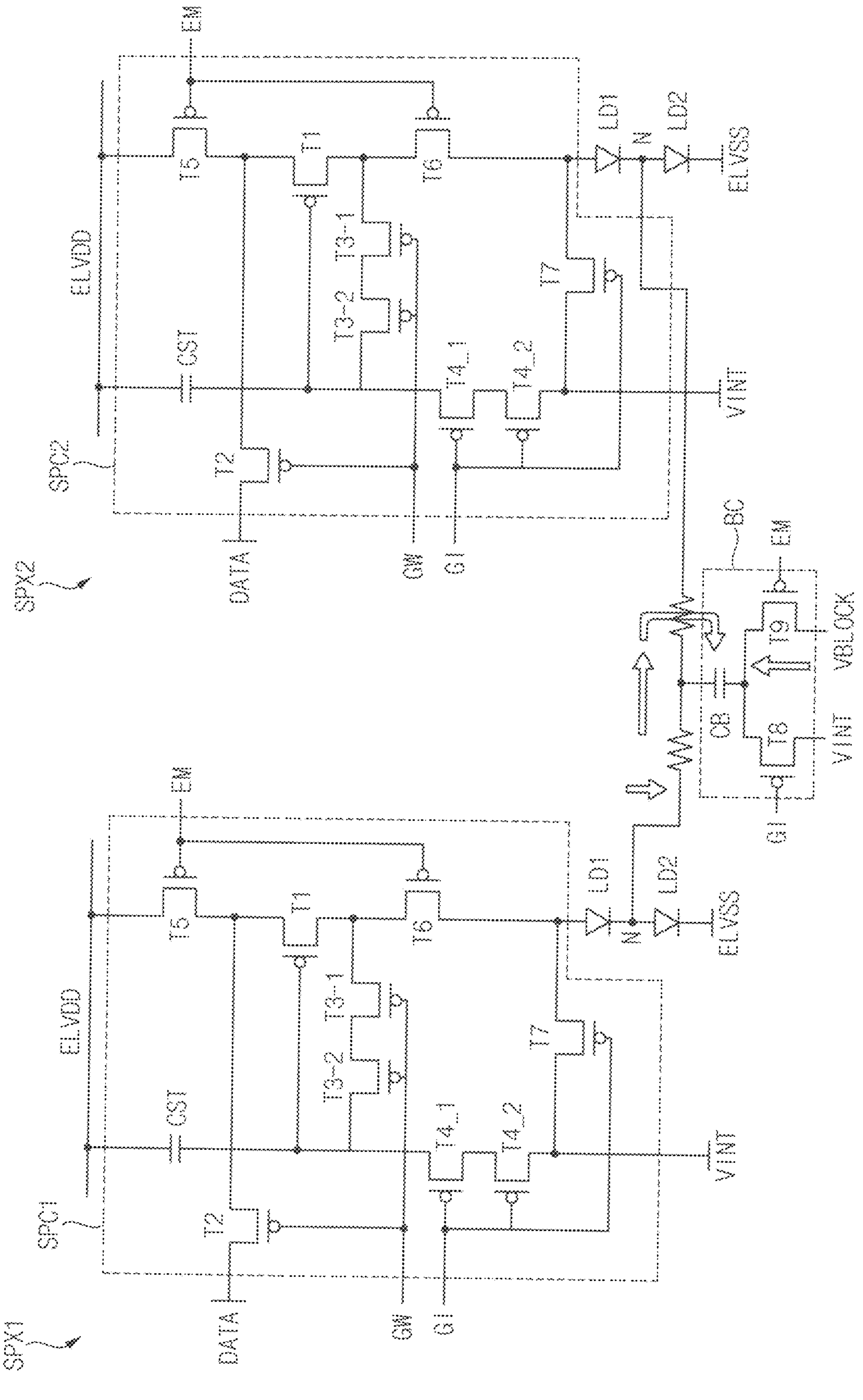
FIG. 3 is a circuit diagram for explaining an operation of a blocking circuit of FIG. 2 during an activation period of a light-emitting control signal.
Figure 4:
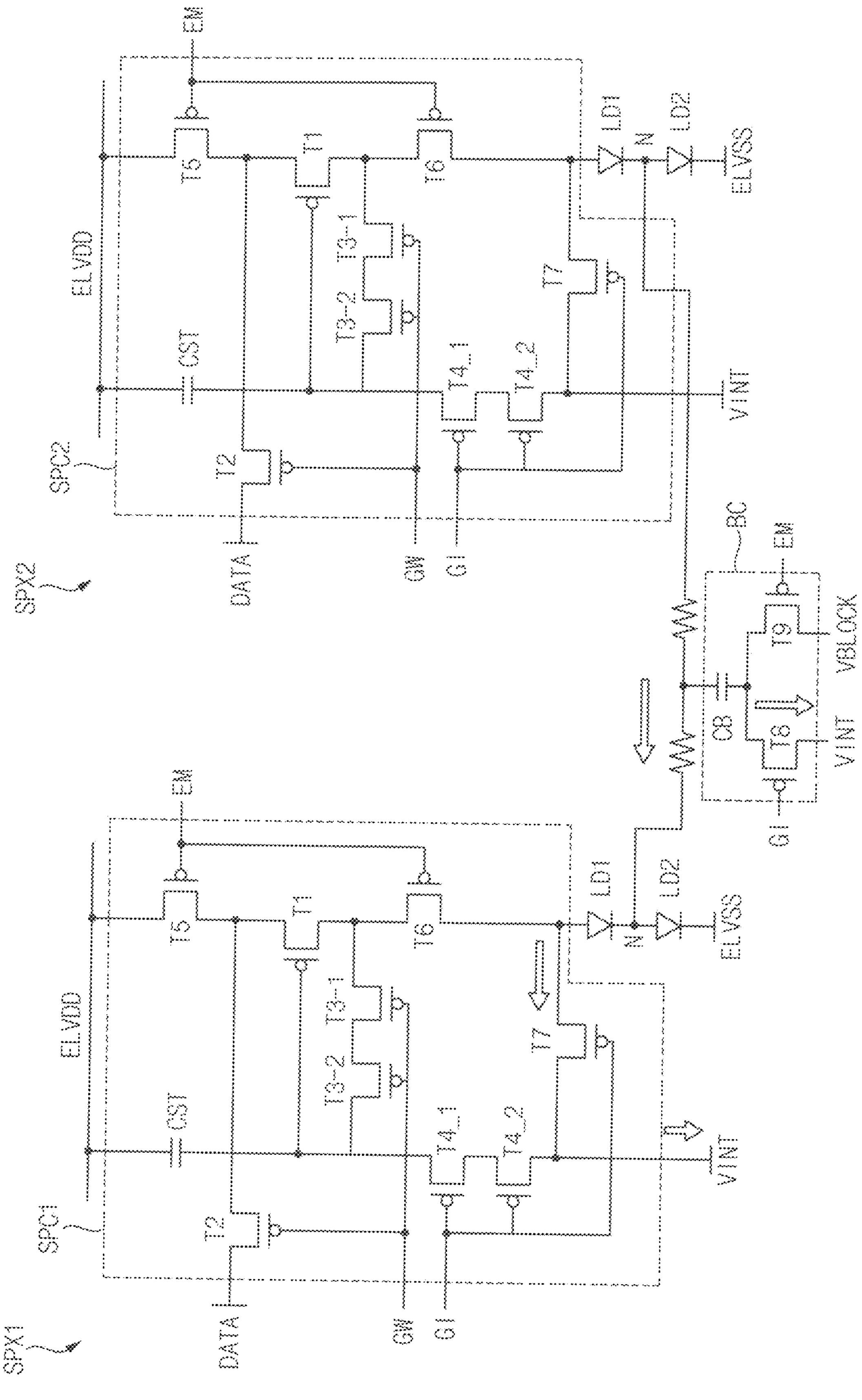
FIG. 4 is a circuit diagram for explaining an operation of a blocking circuit of FIG. 2 during an activation period of a data initialization signal.

FIG. 3 is a circuit diagram for explaining an operation of a blocking circuit of FIG. 2 during an activation period of a light-emitting control signal. FIG. 4 is a circuit diagram for explaining an operation of a blocking circuit of FIG. 2 during an activation period of a data initialization signal.

Referring to FIGS. 3 and 4, while the driving current flows through the first and second light-emitting diodes LD1 and LD2, a leakage current may flow from the first sub-pixel SPX1 to the second sub-pixel SPX2 adjacent to the first sub-pixel SPX1. In this case, the first sub-pixel SPX1 may be a high-gray sub-pixel, and the second sub-pixel SPX2 may be a low-gray sub-pixel.

Referring to FIG. 3, the ninth transistor T9 may supply the blocking voltage VBLOCK to the blocking capacitor CB during the activation period of the light-emitting control signal EM. In this case, the eighth transistor T8 may cut off the supply of the initialization voltage VINT during the inactivation period of the data initialization signal GI. That is, the eighth transistor T8 may be turned off, and the ninth transistor T9 may be turned on. Charges of the leakage current may be stored in the blocking capacitor CB supplied with the blocking voltage VBLOCK. Accordingly, the leakage current from flowing from the first sub-pixel SPX1 to the second sub-pixel SPX2 may be blocked.

Referring to FIG. 4, the eighth transistor T8 may supply the initialization voltage VINT to the blocking capacitor CB during the activation period of the data initialization signal GI. In this case, the ninth transistor T9 may block the supply of the blocking voltage VBLOCK during the inactivation period of the light-emitting control signal EM. That is, the eighth transistor T8 may be turned on, and the ninth transistor T9 may be turned off. In summary, the eighth transistor T8 may initialize the blocking capacitor CB to the initialization voltage VINT during the activation period of the data initialization signal GI. Accordingly, charges of the leakage current stored in the blocking capacitor CB may be discharged.

Figure 5:
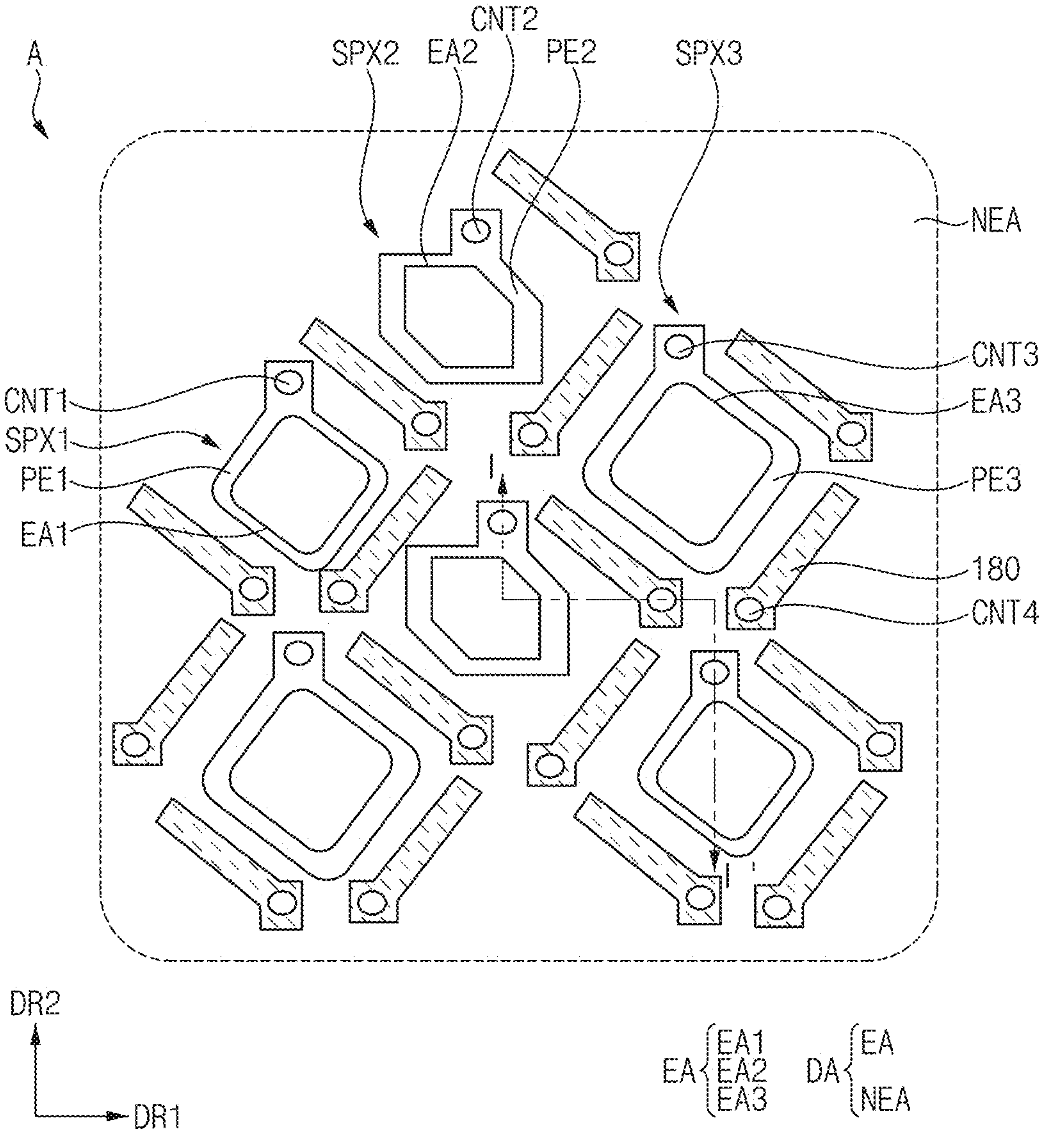
FIG. 5 is a plan view illustrating an enlarged area "A" of FIG. 1.

FIG. 5 is a plan view illustrating an enlarged area "A" of FIG. 1.

Referring to FIGS. 1 and 5, the display area DA may include first, second, and third light-emitting areas EA1, EA2, and EA3 and a non-light-emitting area NEA. The non-light-emitting area NEA may be adjacent to the first to third light-emitting areas EA1, EA2, and EA3. In an embodiment, the non-light-emitting area NEA may surround the first, second, and third light-emitting areas EA1, EA2, and EA3, for example.

As described above, the first sub-pixel SPX1, the second sub-pixel SPX2, and the third sub-pixel SPX3 may be disposed in the display area DA. The first sub-pixel SPX1 may overlap the first light-emitting area EA1, the second sub-pixel SPX2 may overlap the second light-emitting area EA2, and the third sub-pixel SPX3 may overlap the third light-emitting area EA3.

The first pixel electrode PE1 may be disposed in the first light-emitting area EA1, the second pixel electrode PE2 may be disposed in the second light-emitting area EA2, and the third pixel electrode PE3 may be disposed in the third light-emitting area EA3. The first pixel electrode PE1 may be connected to a first semiconductor element (e.g., a first semiconductor element 100*a* of FIG. 6) through a first contact hole CNT1, the second pixel electrode PE2 may be connected to a second semiconductor element (e.g., a second semiconductor element 100*b* of FIG. 6) through a second contact hole CNT2, and the third pixel electrode PE3 may be connected to a semiconductor element through a third contact hole CNT3.

In an embodiment, a plurality of conductive patterns 180 may be disposed in the non-light-emitting area NEA. Each of the conductive patterns 180 may be connected to a semiconductor element (e.g., a third semiconductor element 100*c* of FIG. 6) through a fourth contact hole CNT4.

In an embodiment, each of the conductive patterns 180 may be spaced apart from the first, second, and third pixel electrodes PE1, PE2, and PE3 in a plan view. That is, each of the conductive patterns 180 may not overlap the first, second, and third pixel electrodes PE1, PE2, and PE3 in a plan view.

In an embodiment, each of the conductive patterns 180 may be disposed at a center between two adjacent light-emitting areas among the first, second, and third light-emitting areas EA1, EA2, and EA3 in a plan view. In an embodiment, the conductive pattern 180 may be disposed at a center between the first light-emitting area EA1 and the second light-emitting area EA2, for example.

Figure 6:
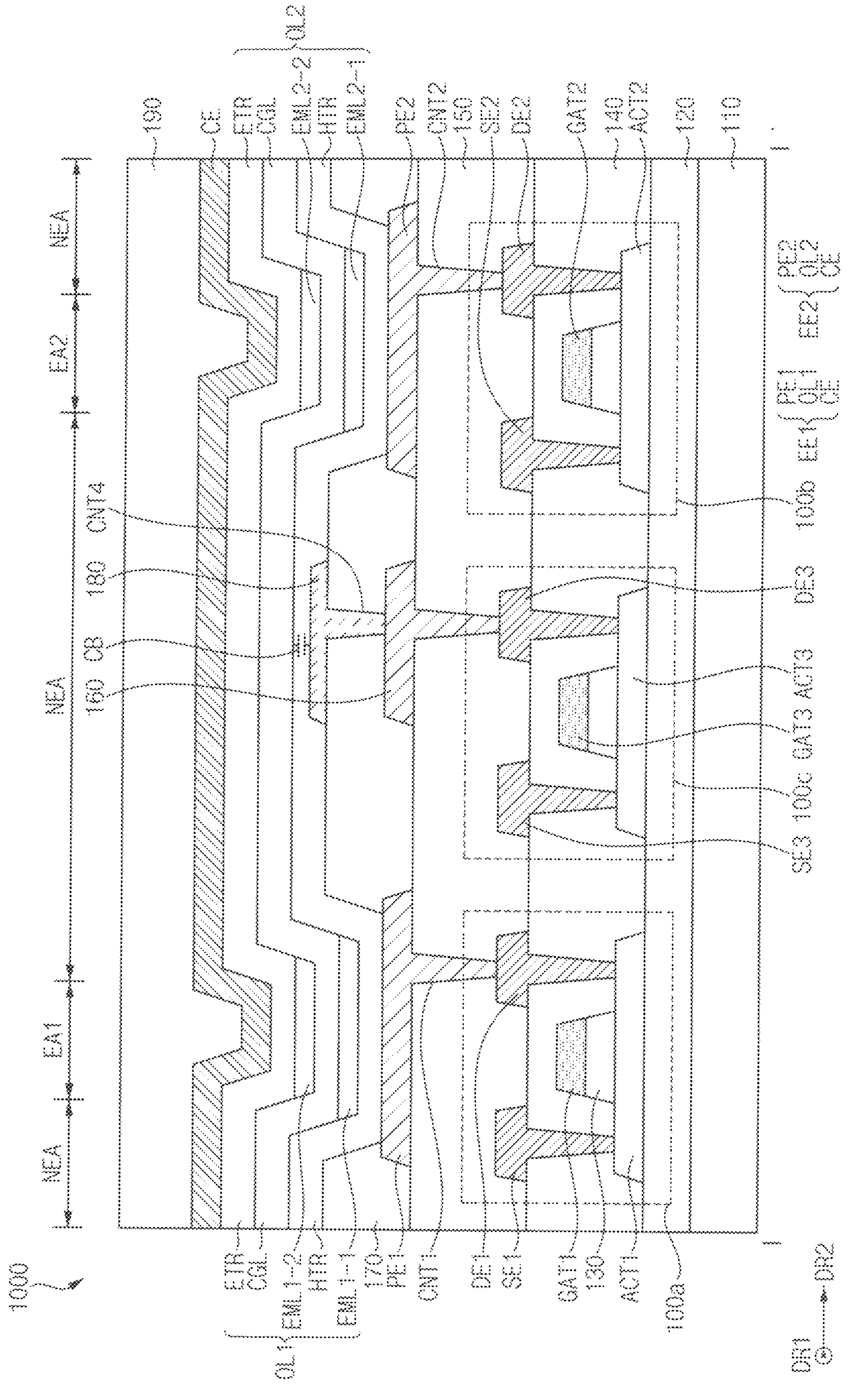
FIG. 6 is a cross-sectional view taken along line I-I' of FIG. 5.

FIG. 6 is a cross-sectional view taken along line I-I' of FIG. 5 and illustrates an embodiment of a cross-sectional structure of the first light-emitting area EA1, the second light-emitting area EA2, and the non-light-emitting area NEA, for example. Although the cross-sectional structure of the third light-emitting area EA3 illustrated in FIG. 5 is not shown in FIG. 6, the cross-sectional structure of the third light-emitting area EA3 may be substantially the same as the cross-sectional structure of the first light-emitting area EA1 and the second light-emitting area EA2.

Referring to FIGS. 5 and 6, the display device 1000 in an embodiment of the disclosure may include a base substrate 110, a buffer layer 120, the first, second, and third semiconductor elements 100*a*, 100*b*, and 100*c*, a gate insulating layer 130, an inter-insulating layer 140, a planarization layer 150, a first light-emitting element EE1, a second light-emitting element EE2, a connection pattern 160, a pixel defining layer 170, the conductive pattern 180 and an encapsulation layer 190.

The first semiconductor element 100*a* may include a first active layer ACT1, a first gate electrode GAT1, a first source electrode SE1, and a first drain electrode DE1. The second semiconductor element 100*b* may include a second active layer ACT2, a second gate electrode GAT2, a second source electrode SE2, and a second drain electrode DE2. The third semiconductor element 100*c* may include a third active layer ACT3, a third gate electrode GAT3, a third source electrode SE3, and a third drain electrode DE3.

The first light-emitting element EE1 may include the first pixel electrode PE1, a first organic layer OL1, and an upper electrode CE. The second light-emitting device EE2 may include the second pixel electrode PE2, a second organic layer OL2, and the upper electrode CE.

The base substrate 110 may include a transparent material or an opaque material. The base substrate 110 may include or consist of a transparent resin substrate. A polyimide substrate or the like is mentioned in an embodiment of the said transparent resin substrate. In this case, the polyimide substrate may include a first organic layer, a first barrier layer, a second organic layer, or the like. In an alternative embodiment, the base substrate 110 may include a quartz substrate, a synthetic quartz substrate, a calcium fluoride substrate, a fluorine-doped quartz substrate, a soda-lime glass substrate, a non-alkali glass substrate, or the like. These may be used alone or in combination with each other.

The buffer layer 120 may be disposed on the base substrate 110. The buffer layer 120 may prevent diffusion of metal atoms or impurities from the base substrate 110 to the first, second, and third semiconductor elements 100*a*, 100*b*, and 100*c*. In addition, when the surface of the base substrate 110 is not uniform, the buffer layer 120 may improve the flatness of the surface of the base substrate 110. In an embodiment, the buffer layer 120 may include an inorganic insulating material such as silicon oxide, silicon nitride, silicon oxynitride, or the like, for example. These may be used alone or in combination.

The first, second, and third active layers ACT1, ACT2, and ACT3 may be disposed on the buffer layer 120. Each of the first, second, and third active layers ACT1, ACT2, and ACT3 may include a metal oxide semiconductor, an inorganic semiconductor (e.g., amorphous silicon, polysilicon), or an organic semiconductor. The first, second, and third active layers ACT1, ACT2, and ACT3 may include the same material. In an embodiment, each of the first, second, and third active layers ACT1, ACT2, and ACT3 may include a source region, a drain region, and a channel region disposed between the source region and the drain region, for example.

The metal oxide semiconductor may include a binary compound ("$AB_x$"), a ternary compound ("$AB_xC_y$"), a quaternary compound ("$AB_xC_yD_z$"), or the like, including or consisting of indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like. In an embodiment, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), or the like, for example. These may be used alone or in combination with each other.

The gate insulating layer 130 may be disposed on each of the first, second, and third active layers ACT1, ACT2, and ACT3. The gate insulating layer 130 may overlap the channel region of each of the first, second, and third active layers ACT1, ACT2, and ACT3. The gate insulating layer 130 may not overlap the source region and the drain region of each of the first, second, and third active layers ACT1, ACT2, and ACT3. In an embodiment, the gate insulating layer 130 may include an inorganic insulating material such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), or the like, for example. These may be used alone or in combination with each other.

The first, second, and third gate electrodes GAT1, GAT2, and GAT3 may be respectively disposed on each of the gate insulating layers 130. Each of the first, second, and third gate electrodes GAT1, GAT2, and GAT3 may overlap each of the gate insulating layers 130. In an embodiment, each of the first, second, and third gate electrodes GAT1, GAT2, and GAT3 may include a metal, an alloy, a metal nitride, a conductive metal oxide, a transparent conductive material, or the like, for example. These may be used alone or in combination with each other. The first, second, and third gate electrodes GAT1, GAT2, and GAT3 may include the same material.

The inter-insulating layer 140 may be disposed on the buffer layer 120. The inter-insulating layer 140 may cover the first, second, and third active layers ACT1, ACT2, and ACT3, the gate insulating layers 130, and the first, second, and third gate electrodes GAT1, GAT2, and GAT3. The inter-insulating layer 140 may sufficiently cover the first, second, and third gate electrodes GAT1, GAT2, and GAT3, and may have a substantially flat upper surface without creating a step around the first, second, and third gate electrodes GAT1, GAT2, and GAT3. In an alternative embodiment, the inter-insulating layer 140 may cover the first, second, and third gate electrodes GAT1, GAT2, and GAT3, and may be disposed along a profile of each of the first, second, and third gate electrodes GAT1, GAT2, and GAT3 with a uniform thickness. In an embodiment, the insulating inter-140 may include an inorganic insulating material such as silicon oxide, silicon nitride, silicon carbide, silicon oxynitride, silicon oxycarbide, or the like, for example. These may be used alone or in combination with each other.

The first, second, and third source electrodes SE1, SE2, and SE3 may be disposed on the inter-insulating layer 140. The first source electrode SE1 may be connected to the source region of the first active layer ACT1 through a contact hole penetrating the gate insulating layer 130 and the inter-insulating layer 140. The second source electrode SE2 may be connected to the source region of the second active layer ACT2 through a contact hole penetrating the gate insulating layer 130 and the inter-insulating layer 140. The third source electrode SE3 may be connected to the source region of the third active layer ACT3 through a contact hole penetrating the gate insulating layer 130 and the inter-insulating layer 140.

The first, second, and third drain electrodes DE1, DE2, and DE3 may be disposed on the inter-insulating layer 140. The first drain electrode DE1 may be connected to the drain region of the first active layer ACT1 through a contact hole penetrating the inter-insulating layer 140. The second drain electrode DE2 may be connected to the drain region of the second active layer ACT2 through a contact hole penetrating the inter-insulating layer 140. The third drain electrode DE3 may be connected to the drain region of the third active layer ACT3 through a contact hole penetrating the inter-insulating layer 140.

In an embodiment, each of the first, second, and third source electrodes SE1, SE2, and SE3 and the first, second, and third drain electrodes DE1, DE2, and DE3 may be a metal, an alloy, a metal nitride, a conductive metal oxide, a transparent conductive material, or the like, for example. These may be used alone or in combination with each other. The first, second, and third drain electrodes DE1, DE2, and DE3 may include the same material as that of the first, second, and third source electrodes SE1, SE2, and SE3.

Accordingly, the first semiconductor element 100*a* including the first active layer ACT1, the first gate electrode GAT1, the first source electrode SE1, and the first drain electrode DE1 may be disposed on the base substrate 110. The second semiconductor element 100*b* including the second active layer ACT2, the second gate electrode GAT2, the second source electrode SE2, and the second drain electrode DE2 may be disposed on the base substrate 110. The third semiconductor element 100*c* including the third active layer ACT3, the third gate electrode GAT3, the third source electrode SE3, and the third drain electrode DE3 may be disposed on the base substrate 110.

Although that the first and second semiconductor elements 100*a* and 100*b* are disposed in the first light-emitting area EA1 and the second light-emitting area EA2, respectively is illustrated in FIG. 6, the disclosure is not limited thereto. In an embodiment, the first and second semiconductor elements 100*a* and 100*b* may be disposed only in the non-light-emitting area NEA, for example. The third semiconductor element 100*c* may be disposed in the non-light-emitting area NEA.

The first semiconductor element 100*a* may correspond to the sixth transistor T6 of the first sub-pixel circuit SPC1 illustrated in FIG. 2. The second semiconductor element 100*b* may correspond to the sixth transistor T6 of the second sub-pixel circuit SPC2 illustrated in FIG. 2. In addition, the third semiconductor element 100*c* may correspond to the eighth transistor T8 or the ninth transistor T9 of the blocking circuit BC illustrated in FIG. 2.

In an embodiment, when the third semiconductor element 100*c* corresponds to the ninth transistor T9 illustrated in FIG. 2, the third gate electrode GAT3 of the third semiconductor element 100*c* may receive a light-emitting control signal (e.g., the light-emitting control signal EM of FIG. 2), and the third source electrode SE3 of the third semiconductor element 100*c* may receive a blocking voltage (e.g., the blocking voltage VBLOCK of FIG. 2). The third semiconductor element 100*c* may supply the blocking voltage to the conductive pattern 180 of the blocking capacitor CB, which will be described later, during the activation period of the light-emitting control signal.

In an embodiment, when the third semiconductor element 100*c* corresponds to the eighth transistor T8 illustrated in FIG. 2, the third gate electrode GAT3 of the third semiconductor element 100*c* may receive a data initialization signal (e.g., the data initialization signal GI of FIG. 2), and the third source electrode SE3 of the third semiconductor element 100*c* may receive an initialization voltage (e.g., the initialization voltage VINT of FIG. 2). The third semiconductor element 100*c* may supply the initialization voltage to the conductive pattern 180 of the blocking capacitor CB, which will be described later, during the activation period of the data initialization signal.

The planarization layer 150 may be disposed on the inter-insulating layer 140. The planarization layer 150 may sufficiently cover the first, second, and third source electrodes SE1, SE2, and SE3 and the first, second, and third drain electrodes DE1, DE2, and DE3. The planarization layer 150 may include an organic insulating material. In an embodiment, the planarization layer 150 may include an organic insulating material such as a phenolic resin, a polyacrylates resin, a polyimides rein, a polyamides resin, a siloxane resin, an epoxy resin, or the like, for example. These may be used alone or in combination with each other.

Each of the first and second pixel electrodes PE1 and PE2 may be disposed in each of the first and second light-emitting areas EA1 and EA2 on the planarization layer 150. The first pixel electrode PE1 may be connected to the first drain electrode DE1 through a first contact hole CNT1 penetrating the planarization layer 150, and the second pixel electrode PE2 may be connected to the second drain electrode DE2 through a second contact hole CNT2 penetrating the planarization layer 150.

In an embodiment, each of the first and second pixel electrodes PE1 and PE2 may include a metal, an alloy, a metal nitride, a conductive metal oxide, a transparent conductive material, or the like, for example. These may be used alone or in combination with each other. The first and third pixel electrodes PE1 and PE2 may include the same material. In an embodiment, each of the first and second pixel electrodes PE1 and PE2 may act as an anode, for example.

The connection pattern 160 may be disposed in the non-light-emitting area NEA on the planarization layer 150. The connection pattern 160 may be connected to the third drain electrode DE3 through a contact hole penetrating the planarization layer 150. In an embodiment, the connection pattern 160 may include a metal, an alloy, a metal nitride, a conductive metal oxide, a transparent conductive material, or the like, for example. These may be used alone or in combination with each other.

In an embodiment, the connection pattern 160 may include the same material as that of the first and second pixel electrodes PE1 and PE2. That is, the connection pattern 160 may be disposed in the same layer as the first and second pixel electrodes PE1 and PE2.

The pixel defining layer 170 may be disposed on the planarization layer 150. The pixel defining layer 170 may expose a portion of an upper surface of each of the first and second pixel electrodes PE1 and PE2. In addition, the pixel defining layer 170 may cover the connection pattern 160. The pixel defining layer 170 may include an inorganic insulating material or an organic material. In an embodiment, the pixel defining layer 170 may include an organic insulating material such as polyimide, for example.

The pixel defining layer 170 may further include a black light-blocking material. In an embodiment, the pixel defining layer 170 may further include a light-blocking material such as a black pigment, a black dye, carbon black, or the like, for example. These may be used alone or in combination with each other.

In an embodiment, the conductive pattern 180 may be disposed in the non-light-emitting area NEA on the pixel defining layer 170. The conductive pattern 180 may be connected to the connection pattern 160 through a fourth contact hole CNT4 penetrating the pixel defining layer 170. Accordingly, the conductive pattern 180 may be electrically connected to the third semiconductor element 100*c* through the connection pattern 160. In an embodiment, the conductive pattern 180 may include a metal, an alloy, a metal nitride, a conductive metal oxide, a transparent conductive material, or the like, for example. These may be used alone or in combination with each other.

In an embodiment, the conductive pattern 180 may constitute a blocking capacitor CB together with a charge generation layer CGL to be described later in the non-light-emitting area NEA.

The first organic layer OL1 may include a hole transport region HTR, an intermediate electron transport region (e.g., an intermediate electron transport region METR of FIG. 7), a first lower light-emitting layer EML1-1, a charge generation layer CGL, an intermediate hole transport region (e.g., an intermediate hole transport region MHTR of FIG. 7), a first upper light-emitting layer EML1-2, and an electron transport region ETR. The second organic layer OL2 may include the hole transport region HTR, the intermediate electron transport region (e.g., an intermediate electron transport region METR of FIG. 8), a second lower light-emitting layer EML2-1, the charge generation layer CGL, the intermediate hole transport region (e.g., an intermediate hole transport region MHTR of FIG. 8), a second upper light-emitting layer EML2-2, and the electron transport region ETR.

That is, the first organic layer OL1 and the second organic layer OL2 may commonly include the hole transport region HTR, the charge generation layer CGL, and the electron transport region ETR. In other words, the hole transport region HTR, the charge generation layer CGL, and the electron transport region ETR may be entirely disposed in the first and second light-emitting areas EA1 and EA2 and the non-light-emitting area NEA. A detailed description of each configuration of the first organic layer OL1 and the second organic layer OL2 will be described later.

As described above, the conductive pattern 180 may constitute the blocking capacitor CB together with the charge generation layer CGL in the non-light-emitting area NEA.

When the third semiconductor element 100*c* supplies the blocking voltage to the conductive pattern 180 of the blocking capacitor CB, the blocking capacitor CB may block a leakage current flowing from a first sub-pixel (e.g., the first sub-pixel SPX1 of FIG. 2) to a second sub-pixel (e.g., the second sub-pixel SPX2 of FIG. 2). Specifically, the leakage current may be blocked from flowing from the first sub-pixel to the second sub-pixel by storing charges of the leakage current in the blocking capacitor CB. When the third semiconductor element 100*c* supplies the initialization voltage to the conductive pattern 180 of the blocking capacitor CB, the charges stored in the blocking capacitor CB may be discharged.

In another embodiment, the conductive pattern 180 may not form the blocking capacitor CB together with the charge generation layer CGL due to the conductivity of the hole transport region HTR. In this case, the leakage current may be induced to a blocking electrode (not shown) through the conductive pattern 180.

The common electrode CE may be disposed on the electron transport region ETR. The common electrode CE may overlap the first and second light-emitting areas EA1 and EA2 and the non-light-emitting area NEA. In an embodiment, the common electrode CE may include a metal, an alloy, a metal nitride, a conductive metal oxide, a transparent conductive material, or the like, for example. These may be used alone or in combination with each other. In an embodiment, the common electrode CE may act as a cathode, for example.

Accordingly, the first light-emitting element EE1 including the first pixel electrode PE1, the first organic layer OL1 and the common electrode CE may be disposed in the first light-emitting area EA1 on the base substrate 110, and the second light-emitting element EE2 including the second pixel electrode PE2, the second organic layer OL2, and the common electrode CE may be disposed in the second light-emitting area EA2 on the base substrate 110.

The encapsulation layer 190 may be disposed on the common electrode CE. The encapsulation layer 190 may overlap the first and second light-emitting areas EA1 and EA2 and the non-light-emitting area NEA. The encapsulation layer 190 may prevent impurities, moisture, external air, or the like from penetrating into the first and second light-emitting elements EE1 and EE2 from an outside. The encapsulation layer 190 may include at least one inorganic encapsulation layer and at least one organic encapsulation layer. In an embodiment, the inorganic encapsulation layer may include silicon oxide, silicon nitride, silicon oxynitride, or the like. These may be used alone or in combination with each other, for example. The organic encapsulation layer may include a cured polymer such as polyacrylate or the like.

However, although the display device 1000 of the disclosure is described by limiting an organic light-emitting display device ("OLED"), the configuration of the disclosure is not limited thereto. In other embodiments, the display device 1000 may include a liquid crystal display device ("LCD"), a field light-emitting display device ("FED"), a plasma display device ("PDP"), an electrophoretic display device ("EPD"), a quantum dot display device, or an inorganic light-emitting display device.

In the display device 1000 in an embodiment of the disclosure, the organic layers OL1 and OL2 disposed on the base substrate 110 may include the lower light-emitting layers EML1-1 and EML2-1, the charge generation layer CGL, and the upper light-emitting layers EML2-1 and EML2-2 that are sequentially disposed. The conductive pattern 180 disposed in the non-light-emitting area NEA surrounding the light-emitting areas EA1 and EA2 on the base substrate 110 may constitute the blocking capacitor CB together with the charge generation layer CGL. Accordingly, since the blocking capacitor CB blocks the leakage current flowing between the adjacent sub-pixels (e.g., the first sub-pixel SPX1 and the second sub-pixel SPX2 of FIG. 5), color mixing defects between the adjacent sub-pixels may be improved.

Figure 7:
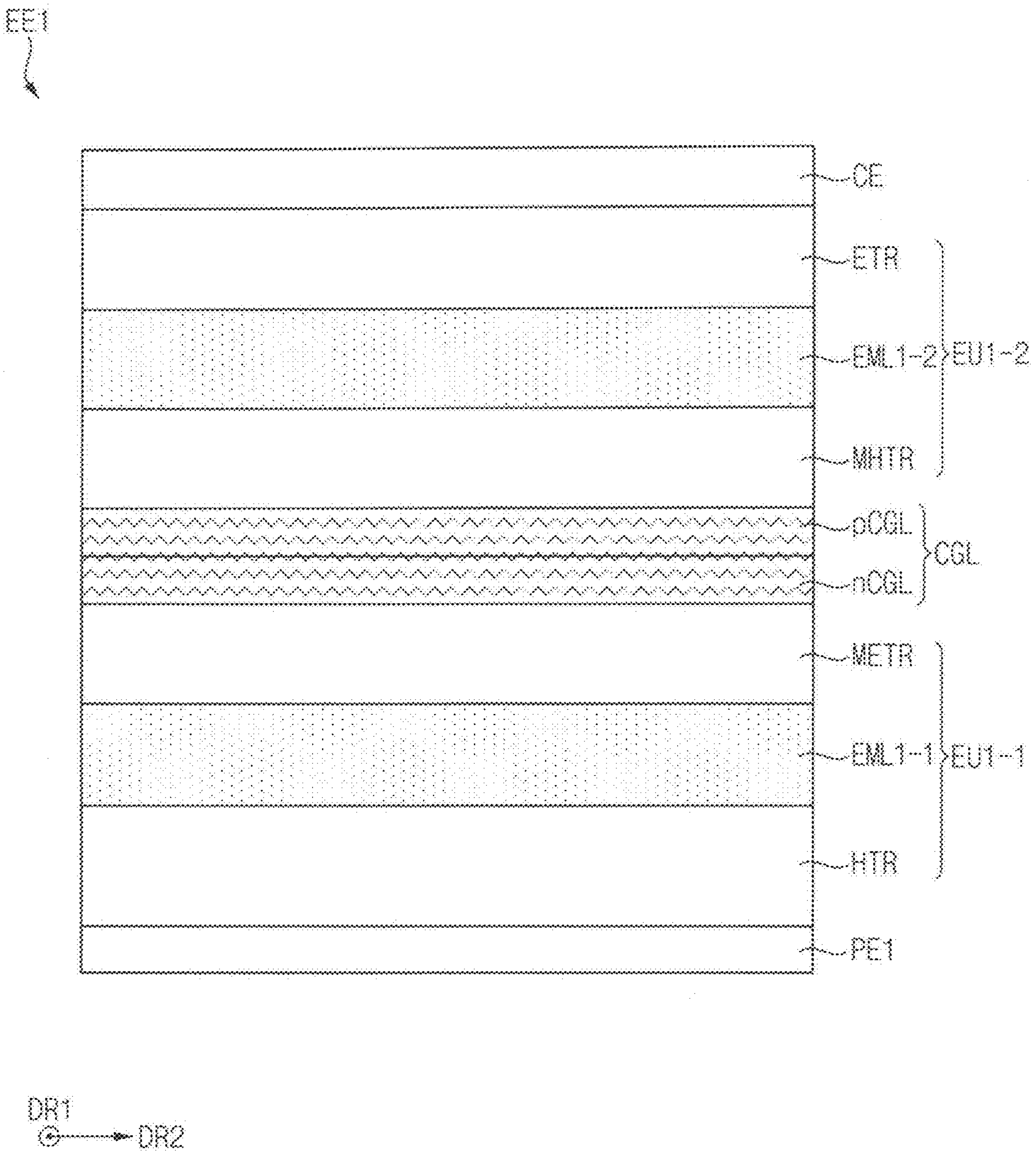
FIG. 7 is a cross-sectional view an enlarged a first light-emitting element of FIG. 6.
Figure 8:
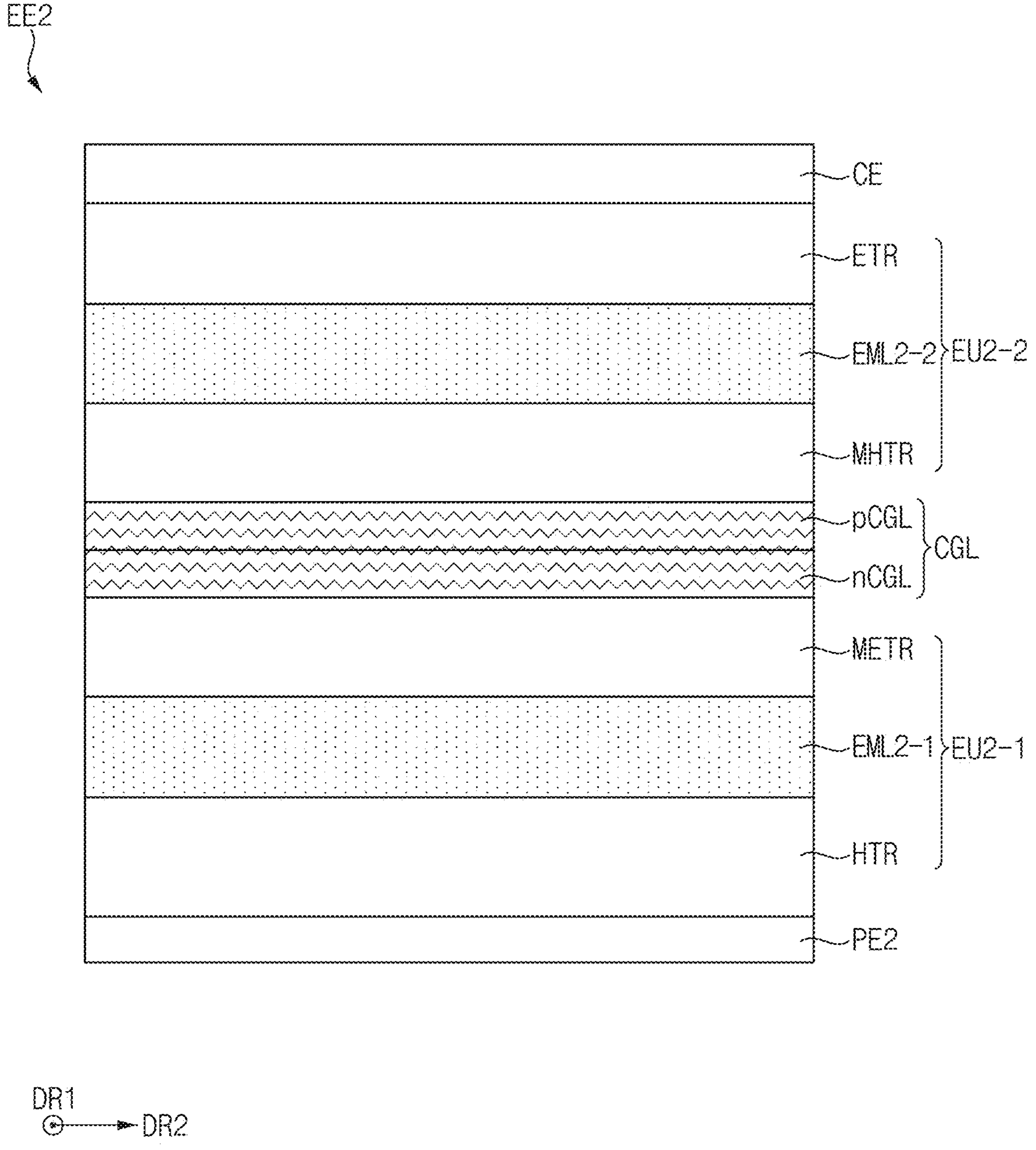
FIG. 8 is a cross-sectional view an enlarged a second light-emitting element of FIG. 6.

FIG. 7 is a cross-sectional view an enlarged a first light-emitting element of FIG. 6. FIG. 8 is a cross-sectional view an enlarged a second light-emitting element of FIG. 6.

Referring to FIGS. 6, 7, and 8, as described above, the first light-emitting element EE1 may include the first pixel electrode PE1, the first organic layer OL1 and the common electrode CE, and the second light-emitting element EE2 may include the second pixel electrode PE2, the second organic layer OL2, and the common electrode CE.

Each of the first and second organic layers OL1 and OL2 may include a plurality of light-emitting structure units. In an embodiment, the first organic layer OL1 may include a (1-1)th light-emitting structure unit EU1-1, the charge generation layer CGL, and the (1-2)th light-emitting structure unit EU1-2, for example. The second organic layer OL2 may include the (2-1)th light-emitting structure unit EU2-1, the charge generation layer CGL, and the (2-2)th light-emitting structure unit EU2-2.

Each of the light-emitting structure units may include a light-emitting layer that generates light according to an applied current. In an embodiment, the (1-1)th light-emitting structure unit EU1-1 may include the hole transport region HTR, the first lower light-emitting layer EML1-1, and the intermediate electron transport region METR, and the (1-2)th light-emitting structure unit EU1-2 may include the intermediate hole transport region MHTR, the first upper light-emitting layer EML1-2, and the electron transport region ETR, for example. In addition, the (2-1)th light-emitting structure unit EU2-1 may include the hole transport region HTR, the second lower light-emitting layer EML2-1, and the intermediate electron transport region METR, and the (2-2)th light-emitting structure unit EU2-2 may include the intermediate hole transport region MHTR, the second upper light-emitting layer EML2-2, and the electron transport region ETR.

The hole transport region HTR may be disposed on the first and second pixel electrodes PE1 and PE2, and may overlap the first and second light-emitting areas EA1 and EA2 and the non-light-emitting area NEA. The hole transport region HTR may include at least one of a hole injection layer and a hole transport layer. In an alternative embodiment, the hole transport region HTR may further include a hole buffer layer, an electron blocking layer, or the like.

The first lower light-emitting layer EML1-1 may be disposed on the hole transport region HTR, and may overlap the first light-emitting area EA1. When electrons and holes are injected into the first lower light-emitting layer EML1-1, the first lower light-emitting layer EML1-1 may emit light of a first color. In an embodiment, the first color may be red, and the first lower light-emitting layer EML1-1 may include an organic material emitting red light, for example.

The second lower light-emitting layer EML2-1 may be disposed on the hole transport region HTR, and may overlap the second light-emitting area EA2. When electrons and holes are injected into the second lower light-emitting layer EML2-1, the second lower light-emitting layer EML2-1 may emit light of the second color. In an embodiment, the second color may be green, and the second lower light-emitting layer EML2-1 may include an organic material emitting green light, for example.

The intermediate electron transport region METR may be disposed on the first and second lower light-emitting layers EML1-1 and EML2-1, and may overlap the first and second light-emitting areas EA1 and EA2 and the non-light-emitting area NEA. The intermediate electron transport region METR may include at least one of an electron injection layer and an electron transport layer. In an alternative embodiment, the intermediate electron transport region METR may further include an electron buffer layer, a hole blocking layer, or the like.

The charge generation layer CGL may be disposed on the first and second lower light-emitting layers EML1-1 and EML2-1 and the intermediate electron transport region METR, and may overlap the first and second light-emitting areas EA1 and EA2 and the non-light-emitting area NEA. The charge generation layer CGL may increase the mobility of electrons toward the first and second lower light-emitting layers EML1-1 and EML2-1, and may increase the mobility of holes toward the first and second upper lower light-emitting layers EML1-1 and EML2-1. In an embodiment, the charge generation layer CGL may include an n-type charge generation layer nCGL and a p-type charge generation layer pCGL disposed on the n-type charge generation layer nCGL, and may have an NP junction structure.

The intermediate hole transport region MHTR may be disposed on the charge generation layer CGL, and may overlap the first and second light-emitting areas EA1 and EA2 and the non-light-emitting area NEA. The intermediate hole transport region MHTR may include at least one of a hole injection layer and a hole transport layer. In an alternative embodiment, the intermediate hole transport region MHTR may further include a hole buffer layer, an electron blocking layer, or the like.

The first upper light-emitting layer EML1-2 may be disposed on the intermediate hole transport region MHTR, and may overlap the first light-emitting area EA1. When electrons and holes are injected into the first upper light-emitting layer EML1-2, the first upper light-emitting layer EML1-2 may emit light of the first color. In an embodiment, the first color may be red, and the first upper light-emitting layer EML1-2 may include an organic material emitting red light, for example.

The second upper light-emitting layer EML2-2 may be disposed on the intermediate hole transport region MHTR and may overlap the second light-emitting area EA2. When electrons and holes are injected into the second upper light-emitting layer EML2-2, the second upper light-emitting layer EML2-2 may emit light of the second color. In an embodiment, the second color may be green, and the second upper light-emitting layer EML2-2 may include an organic material emitting green light, for example.

However, the first color and the second color are not limited thereto. In an embodiment, the first color and the second color may be any one of red, green, and blue, for example.

The electron transport region ETR may be disposed on the first and second upper light-emitting layers EML1-2 and EML2-2, and may overlap the first and second light-emitting areas EA1 and EA2 and the non-light-emitting area NEA. The electron transport region ETR may include at least one of an electron injection layer and an electron transport layer. In an alternative embodiment, the electron transport region ETR may further include an electron buffer layer, a hole blocking layer, or the like.

Although it has been described that each of the first light-emitting element EE1 and the second light-emitting element EE2 includes two light-emitting layers in FIGS. 6, 7 and 8, the disclosure is not limited thereto. In an embodiment, each of the first light-emitting element EE1 and the second light-emitting element EE2 may include three or more light-emitting layers, for example.

FIGS. 9, 10, 11, 12, and 13 are cross-sectional views illustrating a method of manufacturing the display device of FIG. 6.

Figure 9:
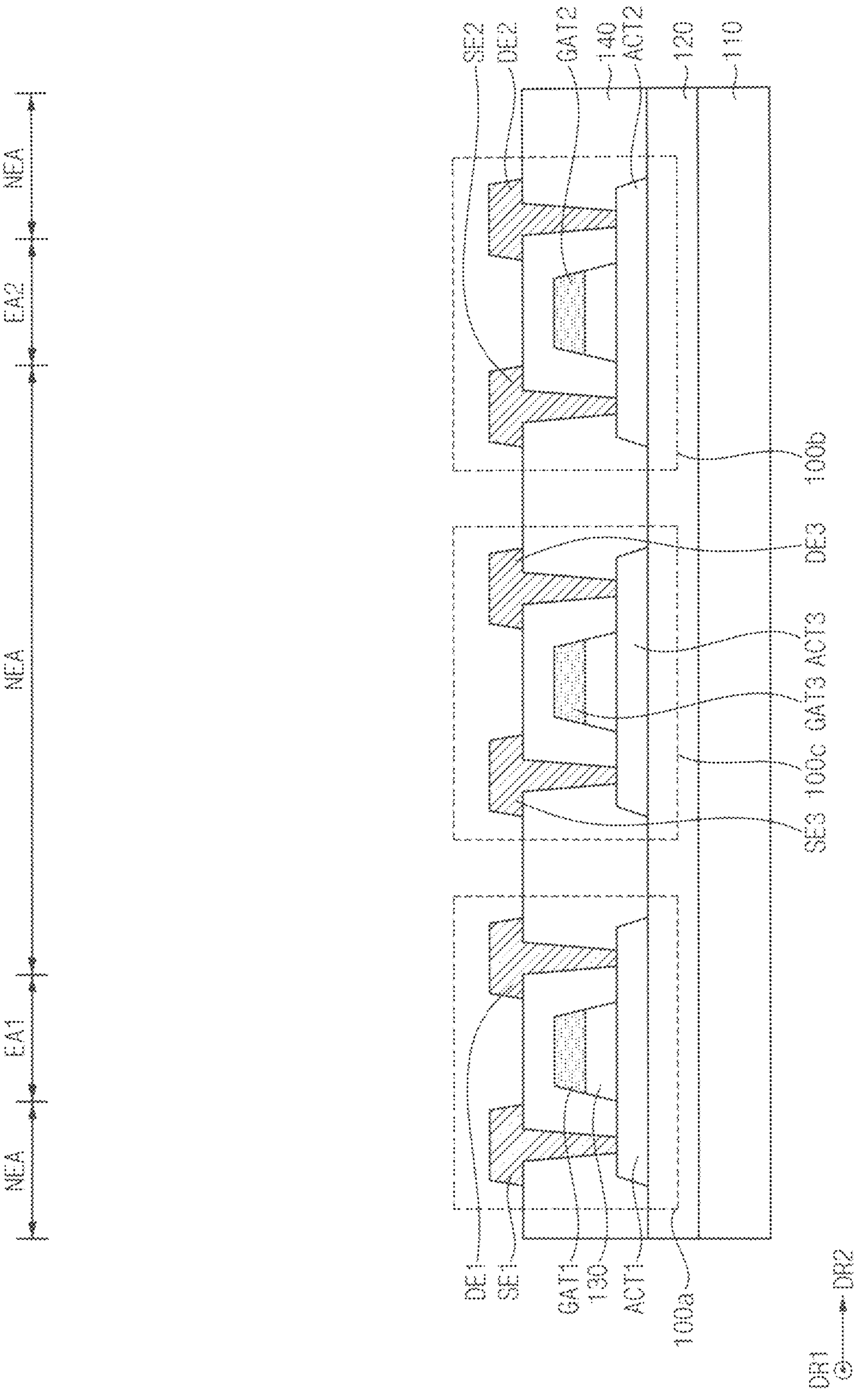
FIGS. 9, 10, 11, 12, and 13 are cross-sectional views illustrating a method of manufacturing the display device of FIG. 6.

Referring to FIG. 9, the buffer layer 120, the first, second, and third active layers ACT1, ACT2, and ACT3, the gate insulating layers 130, the first, second, and third gate electrodes GAT1, GAT2, and GAT3, the inter-insulating layer 140, the first, second, and third source electrodes SE1, SE2, and SE3, and the first, second, and third drain electrodes DE1, DE2, and DE3 may be sequentially formed on the base substrate 110.

Each of the gate insulating layers 130 may be patterned to overlap only the channel region of each of the first, second, and third active layers ACT1, ACT2, and ACT3. In addition, each of the first, second, and third gate electrodes GAT1, GAT2, and GAT3 may be patterned to overlap only each of the gate insulating layers 130. That is, the gate insulating layers 130 and the first, second, and third gate electrodes GAT1, GAT2, and GAT3 may be simultaneously formed through the same process.

Figure 10:
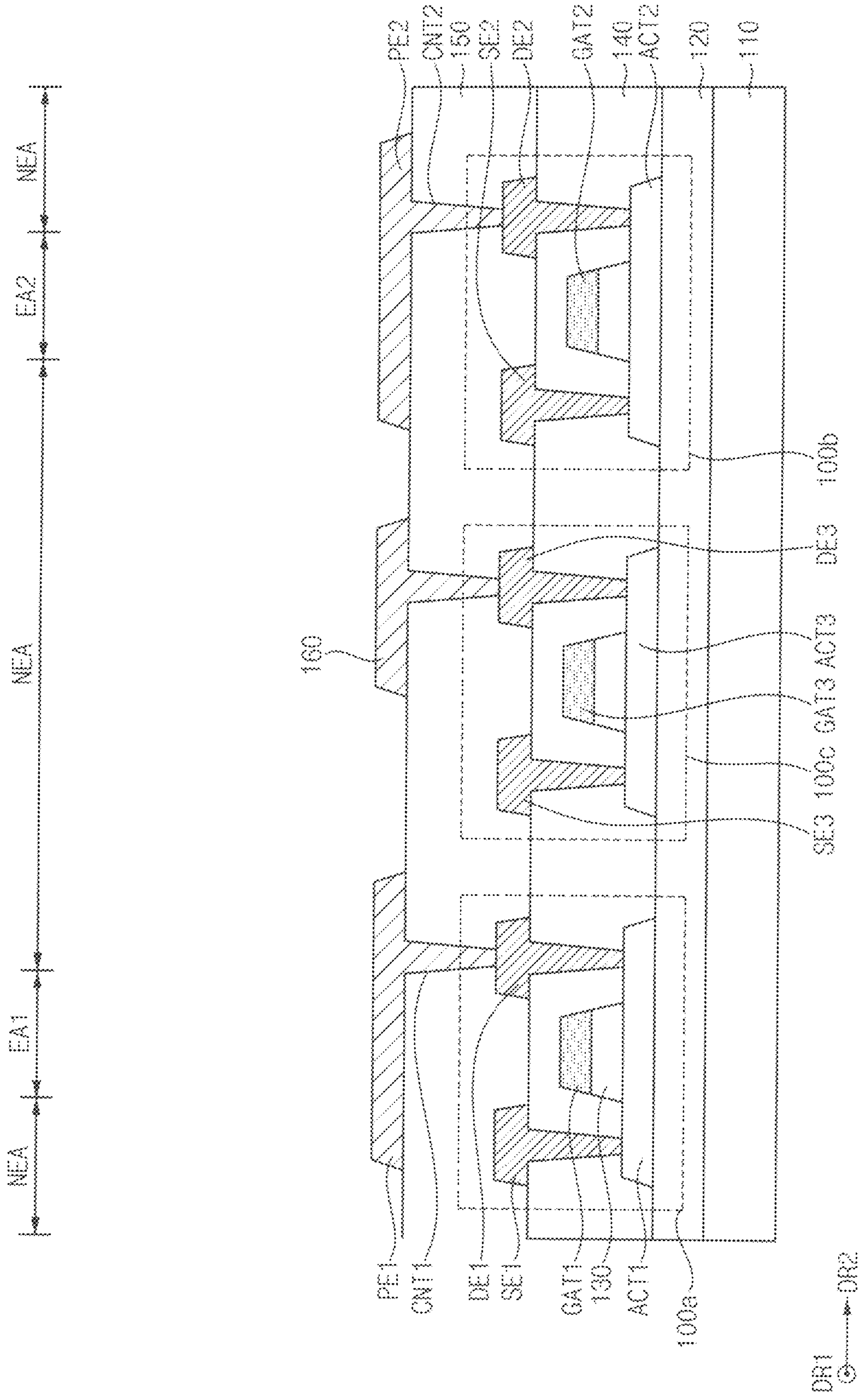

Referring to FIG. 10, the planarization layer 150 may be formed on the inter-insulating layer 140. The planarization layer 150 may be formed to sufficiently cover the first, second, and third source electrodes SE1, SE2, and SE3 and the first, second, and third drain electrodes DE1, DE2, and DE3.

The first pixel electrode PE1, the second pixel electrode PE2, and the connection pattern 160 may be formed on the planarization layer 150. The first pixel electrode PE1 may be connected to the first drain electrode DE1 through the first contact hole CNT1 formed by removing a portion of the planarization layer 150, and the second pixel electrode PE2 may be connected to the second drain electrode DE2 through the second contact hole CNT2 formed by removing a portion of the planarization layer 150. In addition, the connection pattern 160 may be connected to the third drain electrode DE3 through a contact hole defined by removing a portion of the planarization layer 150.

In an embodiment, the first pixel electrode PE1, the second pixel electrode PE2, and the connection pattern 160 may be simultaneously formed using the same material.

Figure 11:
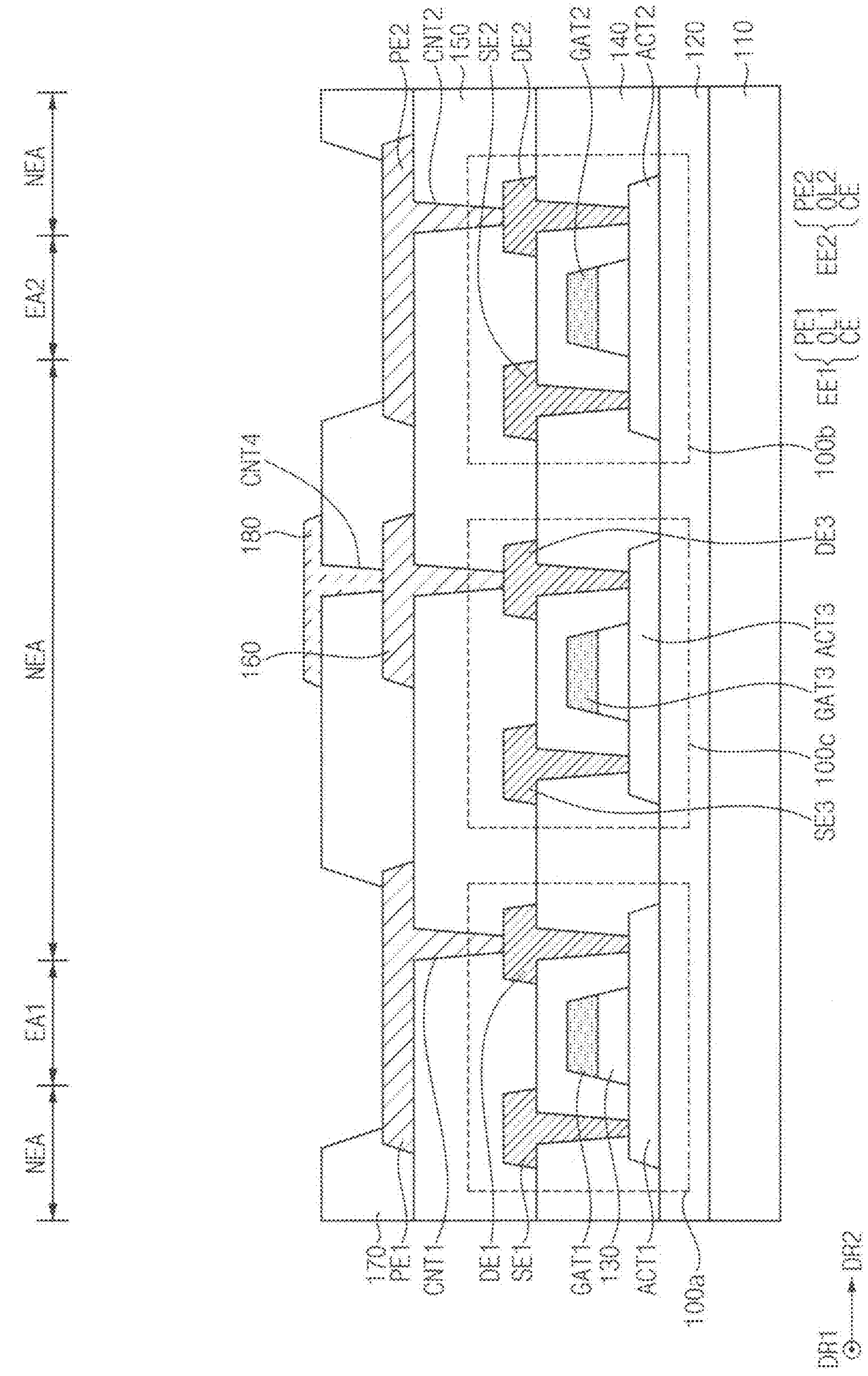

Referring to FIG. 11, an organic layer may be formed on the planarization layer 150 to cover the first pixel electrode PE1, the second pixel electrode PE2, and the connection pattern 160. Next, the organic layer may be etched to expose a portion of an upper surface of each of the first pixel electrode PE1 and the second pixel electrode PE2. The organic layer may be etched to form a pixel defining layer 170.

The conductive pattern 180 may be formed in the non-light-emitting area NEA on the pixel defining layer 170. The conductive pattern 180 may be connected to the connection pattern 160 through the fourth contact hole CNT4 formed by removing a portion of the pixel defining layer 170.

Figure 12:
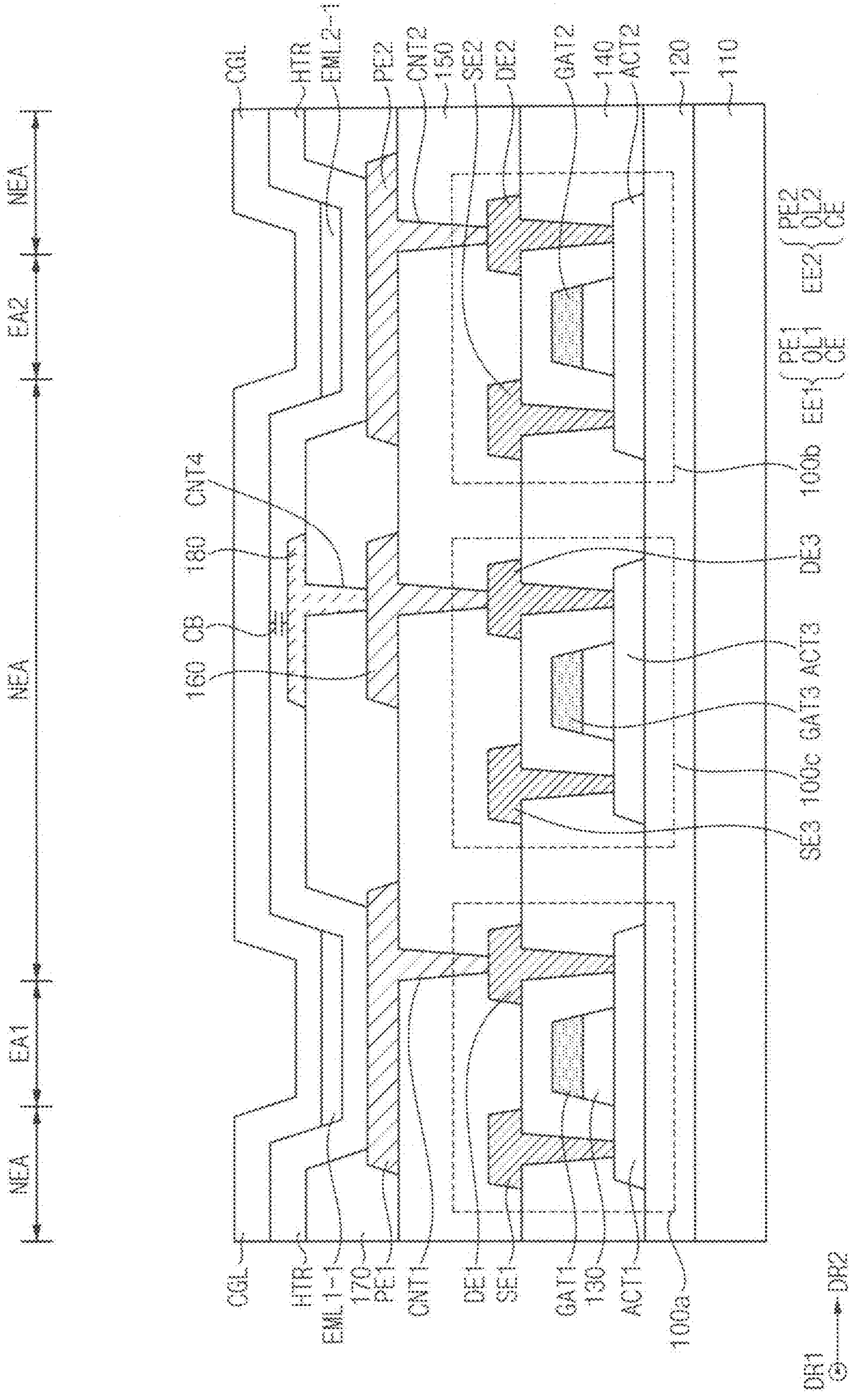
Figure 13:
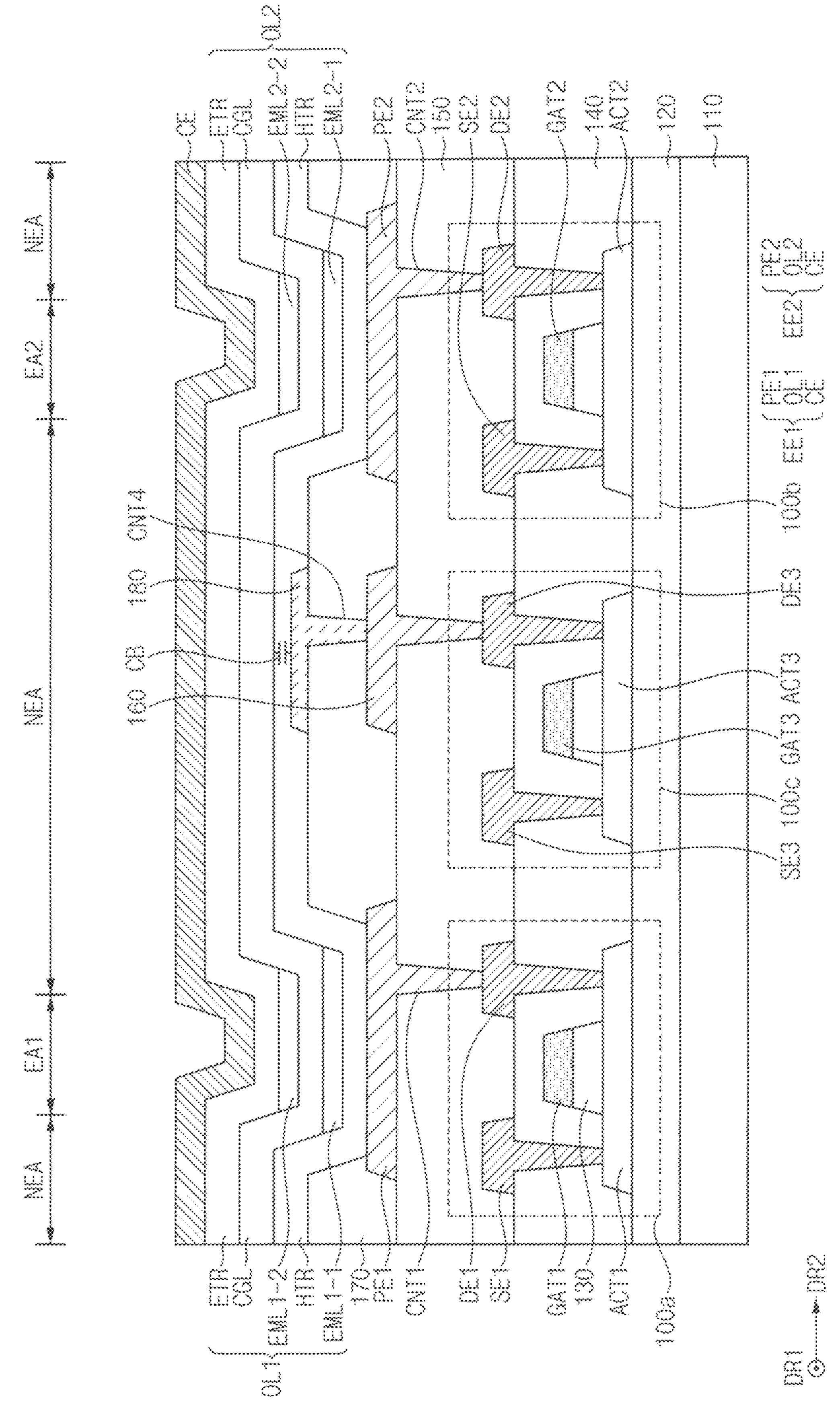

Referring to FIGS. 12 and 13, the hole transport region HTR, the first and second lower light-emitting layers EML1-1 and EML2-1, the charge generation layer CGL, the first and second upper light-emitting layers EML1-2 and EML2-2, and the electron transport region ETR may be sequentially formed on the pixel defining layer 170, the first pixel electrode PE1, and the second pixel electrode PE2.

Referring back to FIG. 6, the encapsulation layer 190 may be formed on the common electrode CE. The encapsulation layer 190 may be entirely formed in the first and second light-emitting areas EA1 and EA2 and the non-light-emitting area NEA.

Accordingly, the display device 1000 illustrated in FIG. 6 may be manufactured.

Figure 14:
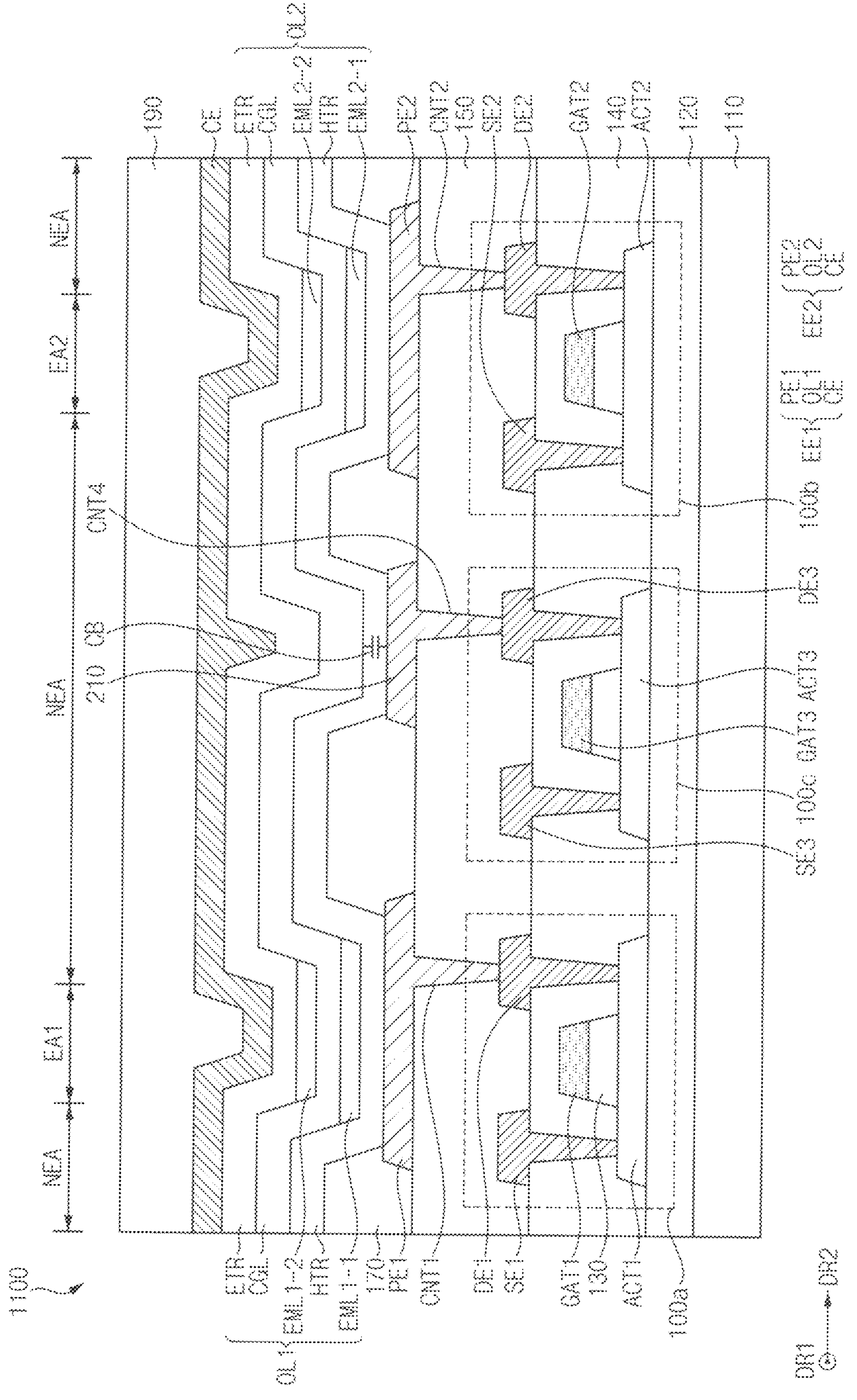
FIG. 14 is a plan view illustrating another embodiment of a display device.

FIG. 14 is a plan view illustrating another embodiment of a display device.

Referring to FIG. 14, the display device 1100 in another embodiment may include the base substrate 110, the buffer layer 120, the first, second, and third semiconductor elements 100*a*, 100*b*, and 100*c*, the gate insulating layer 130, the inter-insulating layer 140, the planarization layer 150, the first light-emitting element EE1, the second light-emitting element EE2, the pixel defining layer 170, the conductive pattern 210, and the encapsulation layer 190. Hereinafter, descriptions that overlap with the display device 1000 described with reference to FIG. 6 will be omitted or simplified.

The conductive pattern 210 may be disposed in the non-light-emitting area NEA on the planarization layer 150. The conductive pattern 210 may be connected to the third drain electrode DE3 through the fourth contact hole CNT4 penetrating the planarization layer 150. In an embodiment, the conductive pattern 210 may include the same material as that of the first pixel electrode PE1 and the second pixel electrode PE2. That is, the conductive pattern 210 may be disposed in the same layer as the first pixel electrode PE1 and the second pixel electrode PE2.

The pixel defining layer 170 may be disposed on the planarization layer 150 and may expose a portion of the upper surface of each of the first and second pixel electrodes PE1 and PE2. In an embodiment, the pixel defining layer 170 may expose a portion of the upper surface of the conductive pattern 210.

The hole transport region HTR may be disposed on the pixel defining layer 170. In an embodiment, the hole transport region HTR may contact the exposed upper surface of the conductive pattern 210.

Figure 15:
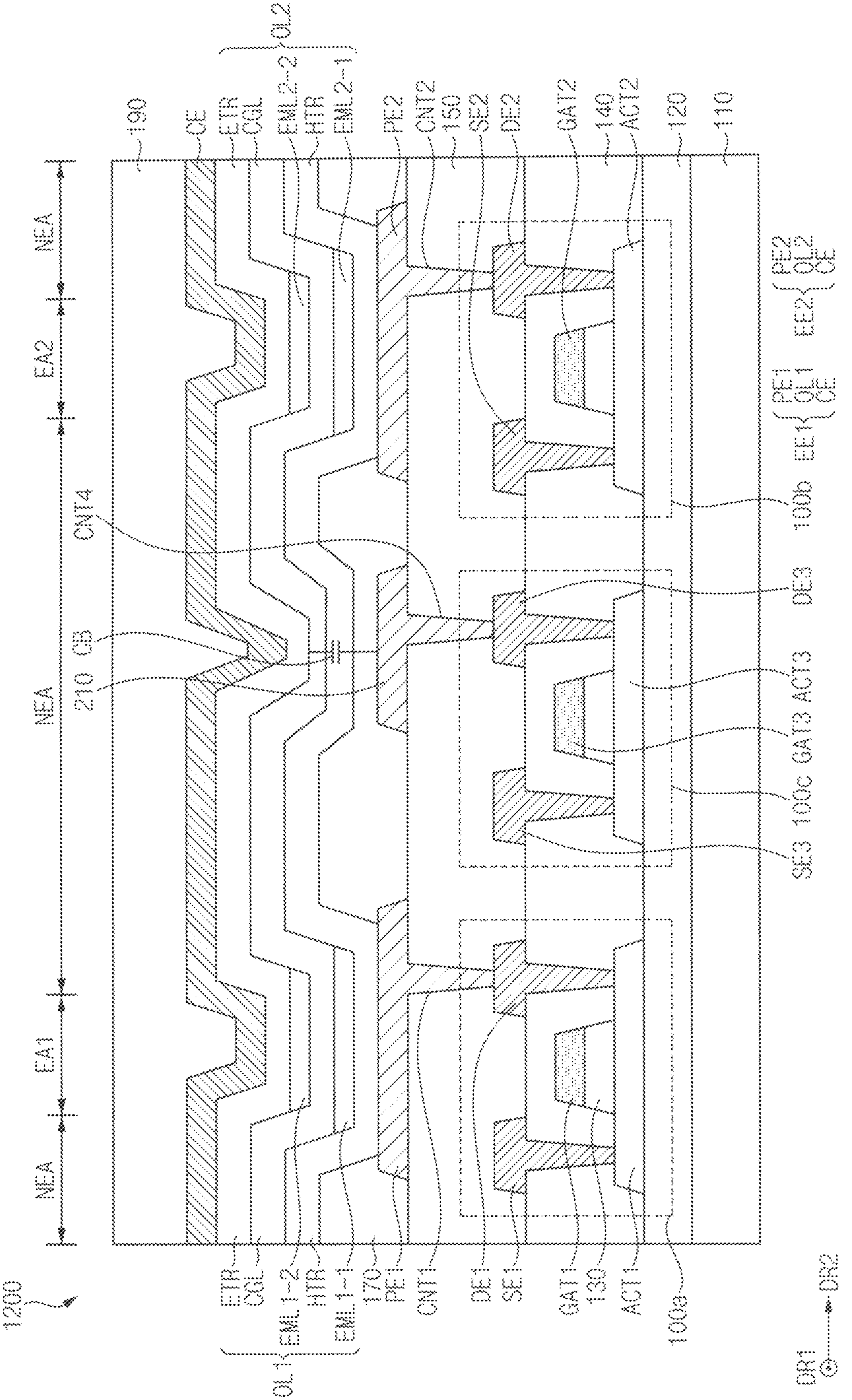
FIG. 15 is a plan view illustrating another embodiment of a display device.

FIG. 15 is a plan view illustrating another embodiment of a display device.

Referring to FIG. 15, the display device 1200 in another embodiment may include the base substrate 110, the buffer layer 120, the first, second, and third semiconductor elements 100*a*, 100*b*, and 100*c*, the gate insulating layer 130, the inter-insulating layer 140, the planarization layer 150, the first light-emitting element EE1, the second light-emitting element EE2, the pixel defining layer 170, the conductive pattern 210, and the encapsulation layer 190. Hereinafter, descriptions that overlap with the display device 1100 described with reference to FIG. 14 will be omitted or simplified.

The conductive pattern 210 may be disposed in the non-light-emitting area NEA on the inter-insulating layer 140. The conductive pattern 210 may be connected to the third drain electrode DE3 through the fourth contact hole CNT4 penetrating the planarization layer 150. In an embodiment, the conductive pattern 210 may include the same material as that of the first pixel electrode PE1 and the second pixel electrode PE2. That is, the conductive pattern 210 may be disposed in the same layer as the first pixel electrode PE1 and the second pixel electrode PE2.

The pixel defining layer 170 may be disposed on the planarization layer 150 and may expose a portion of the upper surface of each of the first and second pixel electrodes PE1 and PE2. In an embodiment, the pixel defining layer 170 may cover the conductive pattern 210. In an embodiment, a portion of the upper surface of the pixel defining layer 170 overlapping the conductive pattern 210 may be disposed at a lower level than a portion of the upper surface of the pixel defining layer 170 not overlapping the conductive pattern 210, for example. In an alternative embodiment, a portion of the upper surface of the pixel defining layer 170 overlapping the conductive pattern 210 may be disposed at the same level as a portion of the upper surface of the pixel defining layer 170 not overlapping the conductive pattern 210.

Figure 16:
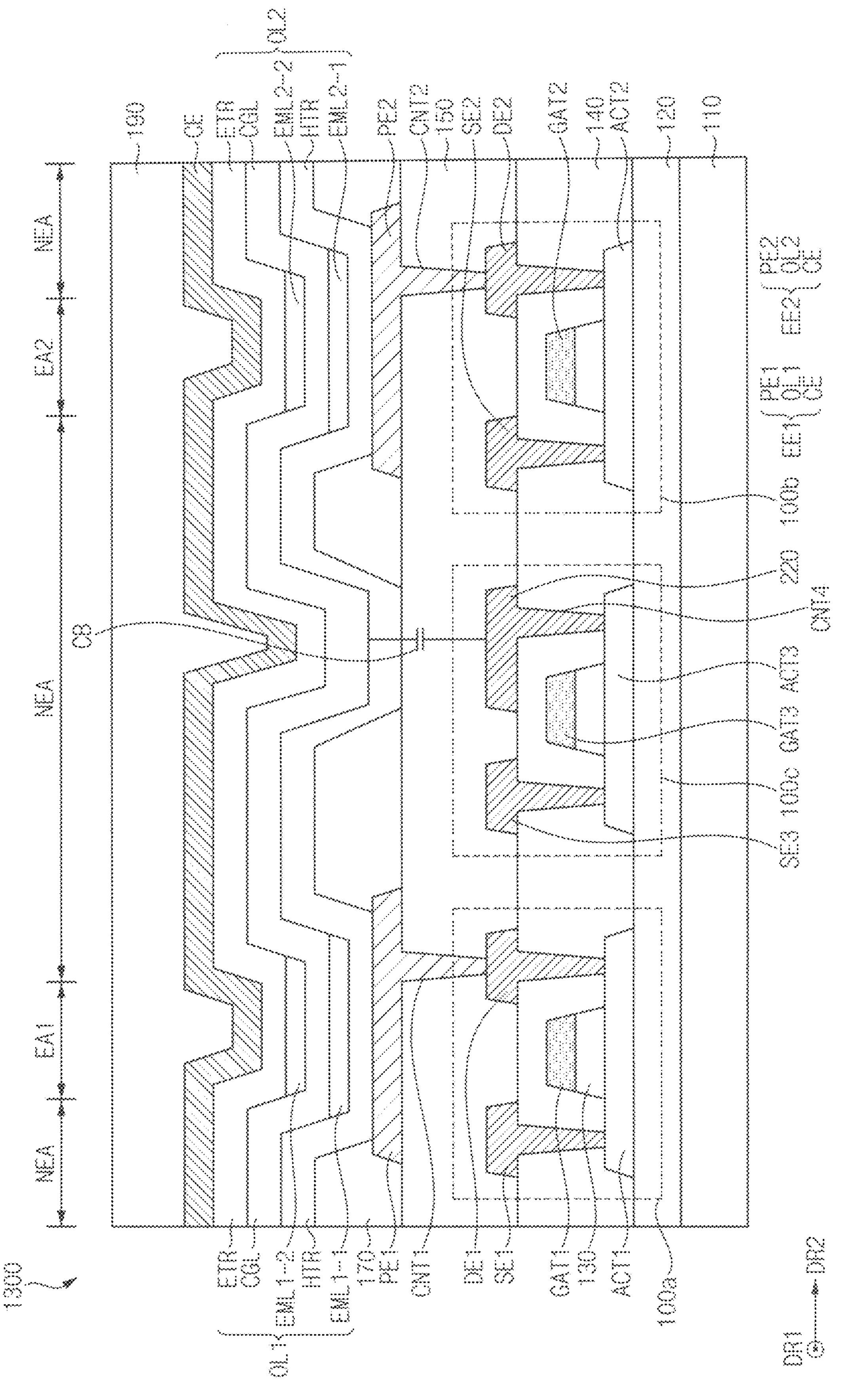
FIG. 16 is a plan view illustrating another embodiment of a display device.

FIG. 16 is a plan view illustrating another embodiment of a display device.

Referring to FIG. 16, the display device 1300 in another embodiment may include the base substrate 110, the buffer layer 120, the first, second, and third semiconductor elements 100*a*, 100*b*, and 100*c*, the gate insulating layer 130, the inter-insulating layer 140, the planarization layer 150, the first light-emitting element EE1, the second light-emitting element EE2, the pixel defining layer 170, and the encapsulation layer 190. Hereinafter, descriptions that overlap with the display device 1000 described with reference to FIG. 6 will be omitted or simplified.

The third semiconductor element 100*c* may include the third active layer ACT3, the third gate electrode GAT3, the third source electrode SE3, and the conductive pattern 220. Here, the conductive pattern 220 may serve as a drain electrode. The conductive pattern 220 may be connected to the drain region of the third active layer ACT3 through the fourth contact hole CNT4 penetrating the inter-insulating layer 140.

In an embodiment, the conductive pattern 220 may include the same material as that of the first, second, and third source electrodes SE1, SE2, and SE3 and the first and second drain electrodes DE1 and DE2. That is, the conductive pattern 220 may be disposed in the same layer as the first, second, and third source electrodes SE1, SE2, and SE3 and the first and second drain electrodes DE1 and DE2.

The planarization layer 150 may be disposed on the inter-insulating layer 140, and the planarization layer 150 may sufficiently cover the conductive pattern 220. The pixel defining layer 170 may be disposed on the planarization layer 150 and may expose a portion of the upper surface of each of the first and second pixel electrodes PE1 and PE2. In an embodiment, the pixel defining layer 170 may expose the upper surface of the planarization layer 150 overlapping the conductive pattern 220. In an alternative embodiment, the pixel defining layer 170 may not expose the upper surface of the planarization layer 150 overlapping the conductive pattern 220.

Figure 17:
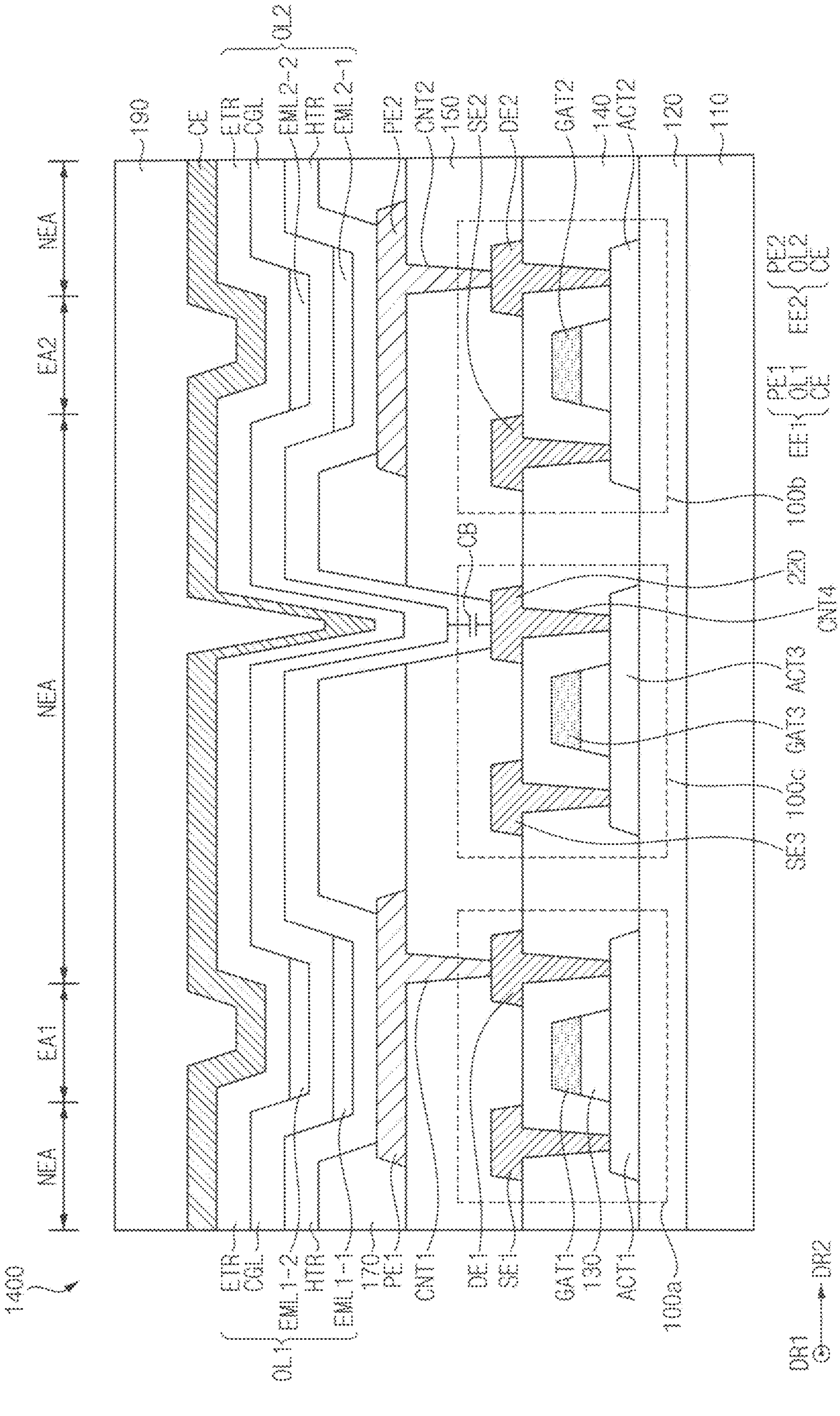
FIG. 17 is a plan view illustrating another embodiment of a display device.

FIG. 17 is a plan view illustrating another embodiment of a display device.

Referring to FIG. 17, the display device 1400 in another embodiment may include the base substrate 110, the buffer layer 120, the first, second, and third semiconductor elements 100*a*, 100*b*, and 100*c*, the gate insulating layer 130, the inter-insulating layer 140, the planarization layer 150, the first light-emitting element EE1, the second light-emitting element EE2, the pixel defining layer 170, and the encapsulation layer 190. Hereinafter, descriptions that overlap with the display device 1300 described with reference to FIG. 16 will be omitted or simplified.

The third semiconductor element 100*c* may include the third active layer ACT3, the third gate electrode GAT3, the third source electrode SE3, and the conductive pattern 220. Here, the conductive pattern 220 may serve as a drain electrode. The conductive pattern 220 may be connected to the drain region of the third active layer ACT3 through the fourth contact hole CNT4 penetrating the inter-insulating layer 140.

In an embodiment, the conductive pattern 220 may include the same material as that of the first, second, and third source electrodes SE1, SE2, and SE3 and the first and second drain electrodes DE1 and DE2. That is, the conductive pattern 220 may be disposed in the same layer as the first, second, and third source electrodes SE1, SE2, and SE3 and the first and second drain electrodes DE1 and DE2.

The planarization layer 150 may be disposed on the inter-insulating layer 140. The pixel defining layer 170 may be disposed on the planarization layer 150 and may expose a portion of the upper surface of each of the first and second pixel electrodes PE1 and PE2. In an embodiment, the planarization layer 150 and the pixel defining layer 170 may expose a portion of the upper surface of the conductive pattern 220.

The hole transport region HTR may be disposed on the pixel defining layer 170. In an embodiment, the hole transport region HTR may contact the exposed upper surface of the conductive pattern 220.

Figure 18:
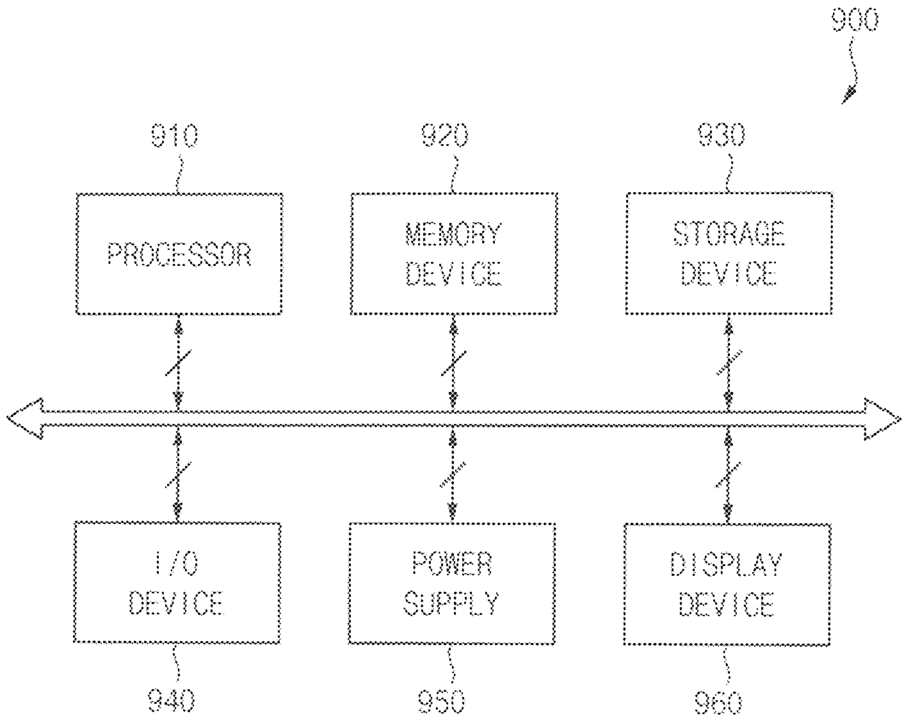
FIG. 18 is a block diagram illustrating an electronic device including the display device of FIG. 1.
Figure 19:
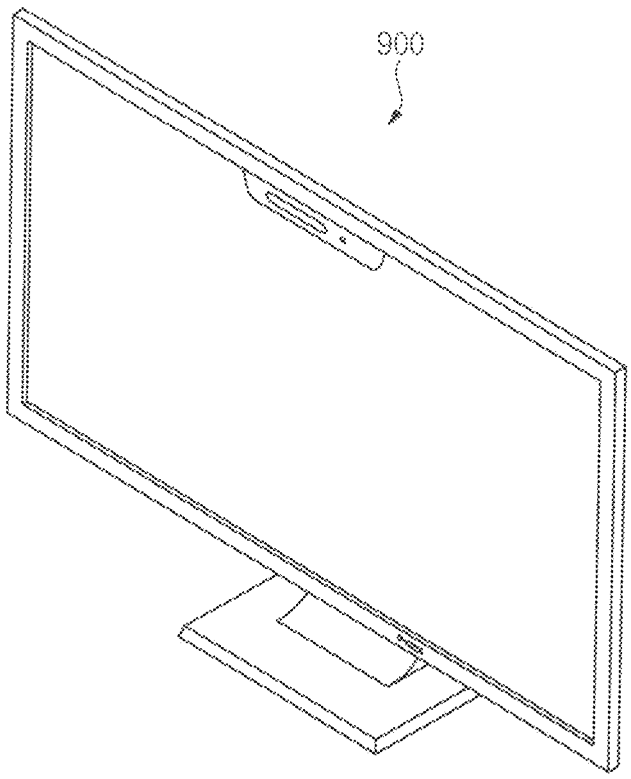
FIG. 19 is a diagram illustrating an embodiment in which the electronic device of FIG. 18 is implemented as a television.
Figure 20:
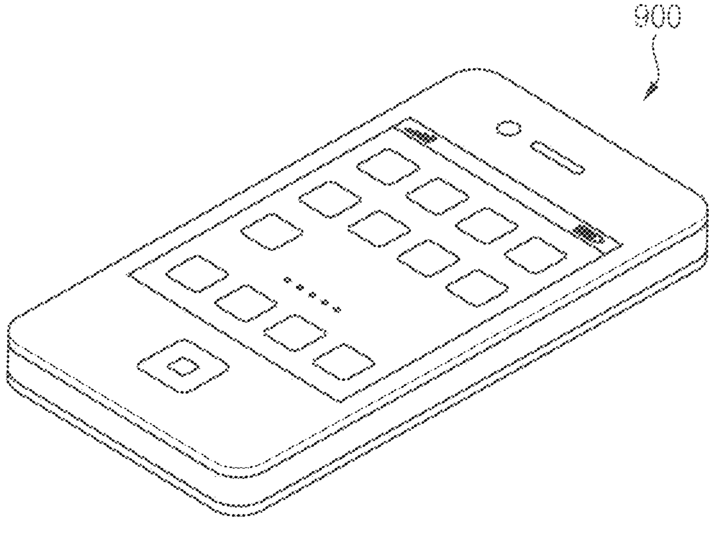
FIG. 20 is a diagram illustrating an embodiment in which the electronic device of FIG. 18 is implemented as a smartphone.

FIG. 18 is a block diagram illustrating an electronic device including the display device of FIG. 1. FIG. 19 is a diagram illustrating an embodiment in which the electronic device of FIG. 18 is implemented as a television. FIG. 20 is a diagram illustrating an embodiment in which the electronic device of FIG. 18 is implemented as a smartphone.

Referring to FIGS. 18, 19 and 20, in an embodiment, the electronic device 900 may include a processor 910, a memory device 920, a storage device 930, an input/output ("I/O") device 940, a power supply 950 and a display device 960. In this case, the display device 960 may correspond to the display device 1000 described with reference to FIGS. 1 to 10. The electronic device 900 may further include various ports capable of communicating with a video card, a sound card, a memory card, a USB device, or the like.

In an embodiment, as illustrated in FIG. 19, the electronic device 900 may be implemented as a television. In another embodiment, as illustrated in FIG. 20, the electronic device 900 may be implemented as a smart phone. However, the disclosure is not limited thereto, in another embodiment, the electronic device 900 may be implemented as a cellular phone, a video phone, a smart pad, a smart watch, a tablet personal computer ("PC"), a car navigation system, a computer monitor, a laptop, a head mounted display ("MID"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a compact disc read-only memory ("CD-ROM") device, or the like.

The I/O device 940 may include an input device such as a keyboard, a keypad, a mouse device, a touchpad, a touch screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The disclosure may be applied to various display devices. In an embodiment, the disclosure is applicable to various display devices such as display devices for vehicles, ships and aircraft, portable communication devices, display devices for exhibition or information transmission, medical display devices, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A display device comprising:

a base substrate including first, second, and third light-emitting areas which respectively emit light of different colors and a non-light-emitting area surrounding the first, second, and third light-emitting areas;

an organic layer including:

- a hole transport region disposed on the base substrate;
- a lower light-emitting layer disposed in each of the first, second, and third light-emitting areas on the hole transport region;
- a charge generation layer disposed on the lower light-emitting layer;
- an upper light-emitting layer disposed in each of the first, second, and third light-emitting areas on the charge generation layer; and
- an electron transport region disposed on the upper light-emitting layer; and a conductive pattern disposed in the non-light-emitting area on the base substrate, wherein the charge generation layer and the conductive pattern form a blocking capacitor.

2. The display device of claim 1, further comprising:

a pixel electrode disposed in each of the first, second, and third emitting areas between the base substrate and the organic layer;

a connection pattern in the non-light-emitting area on the base substrate and including a same material as a material of the pixel electrode; and a pixel defining layer disposed on the base substrate, exposing a portion of an upper surface of the pixel electrode, and covering the connection pattern.

3. The display device of claim 2, wherein the conductive pattern is spaced apart from the pixel electrode in a plan view.

4. The display device of claim 2, wherein the conductive pattern is disposed on the pixel defining layer and connected to the connection pattern through a contact hole penetrating the pixel defining layer.

5. The display device of claim 1, wherein the hole transport region covers the conductive pattern.

6. The display device of claim 1, further comprising:

a pixel electrode disposed in each of the first, second, and third emitting areas between the base substrate and the organic layer;

wherein the conductive pattern includes a same material as a material of the pixel electrode.

7. The display device of claim 6, further comprising:

a pixel defining layer disposed on the base substrate and exposing a portion of an upper surface of the pixel electrode and a portion of an upper surface of the conductive pattern, wherein the hole transport region contacts the portion of the upper surface of the conductive pattern exposed by the pixel defining layer.

8. The display device of claim 6, further comprising:

a pixel defining layer disposed on the base substrate, exposing a portion of an upper surface of the pixel electrode, and covering the conductive pattern.

9. The display device of claim 1, further comprising:

an active layer disposed on the base substrate;

a gate electrode disposed on the active layer;

a source electrode disposed on the gate electrode; and a drain electrode disposed in a same layer as the source electrode.

10. The display device of claim 9, wherein the conductive pattern includes a same material as a material of the source electrode and the drain electrode.

11. The display device of claim 10, further comprising:

a planarization layer disposed on the base substrate and covering the source electrode, the drain electrode, and the conductive pattern.

12. The display device of claim 11, wherein the planarization layer includes an organic insulating material.

13. The display device of claim 10, further comprising:

a planarization layer disposed on the base substrate, covering the source electrode and the drain electrode, and exposing a portion of an upper surface of the conductive pattern.

14. The display device of claim 13, wherein the planarization layer includes an organic insulating material.

15. The display device of claim 1, wherein the conductive pattern is provided in plural.

16. The display device of claim 15, wherein each of conductive patterns is disposed at a center between two adjacent light-emitting areas among the first, second, and third areas in a plan view.

17. The display device of claim 1, further comprising:

a semiconductor element disposed in the non-light-emitting area on the base substrate and electrically connected to the conductive pattern.

18. The display device of claim 17, wherein the semiconductor element includes:

a gate electrode which receives a light-emitting control signal;

a source electrode which receives a blocking voltage; and a drain electrode connected to the conductive pattern of the blocking capacitor, and wherein the semiconductor element supplies the blocking voltage to the conductive pattern of the blocking capacitor during an activation period of the light-emitting control signal.

19. The display device of claim 17, wherein the semiconductor element includes:

a gate electrode which receives a data initialization signal;

a source electrode which receives an initialization voltage; and a drain electrode connected to the conductive pattern of the blocking capacitor, and wherein the semiconductor element supplies the initialization voltage to the conductive pattern of the blocking capacitor during an activation period of the data initialization signal.

20. An electronic device comprising:

a display device comprising:

a base substrate;

a pixel electrode disposed on the base substrate;

a connection pattern disposed on the base substrate and including a same material as a material of the pixel electrode;

an organic layer including:

a lower light-emitting layer disposed on the pixel electrode;

a charge generation layer disposed on the lower light-emitting layer; and an upper light-emitting layer disposed on the charge generation layer; and a conductive pattern disposed on the connection pattern, wherein the charge generation layer and the conductive pattern form a blocking capacitor.

21. The electronic device of claim 20, further comprising:

a pixel defining layer disposed on the base substrate, exposing a portion of an upper surface of the pixel electrode, and covering the connection pattern, wherein the conductive pattern is connected to the connection pattern through a contact hole penetrating the pixel defining layer.

22. The electronic device of claim 20, wherein the conductive pattern is spaced apart from the pixel electrode in a plan view.

23. The electronic device of claim 20, wherein the conductive pattern is plural.

24. The electronic device of claim 20, further comprising:

a semiconductor element disposed between the base substrate and the connection pattern, and electrically connected to the connection pattern, wherein the semiconductor element supplies a blocking voltage or an initialization voltage to the conductive pattern of the blocking capacitor.

* * * * *